(12) United States Patent
Goda et al.

(10) Patent No.: US 7,919,389 B2
(45) Date of Patent: Apr. 5, 2011

(54) SEMICONDUCTOR MEMORY DEVICE THAT IS RESISTANT TO HIGH VOLTAGES AND A METHOD OF MANUFACTURING THE SAME

(75) Inventors: Akira Goda, Kanagawa (JP); Mitsuhiro Noguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/498,149

(22) Filed: Jul. 6, 2009

(65) Prior Publication Data

US 2009/0267136 A1     Oct. 29, 2009

Related U.S. Application Data

(62) Division of application No. 10/954,238, filed on Oct. 1, 2004, now abandoned.

(30) Foreign Application Priority Data

Oct. 2, 2003   (JP) ................................. 2003-344689

(51) Int. Cl.
*H01L 21/76* (2006.01)

(52) U.S. Cl. . 438/427; 438/261; 438/294; 257/E29.018; 257/E21.54

(58) Field of Classification Search .................. 438/261, 438/294, 216, 591, 593, 207, 201, 211, 257, 438/218, 219, 427, 153, 154; 257/E21.409, 257/E29.309, E27.091, E21.54, E29.018, 257/E29.02

See application file for complete search history.

(56) References Cited

U.S. PATENT DOCUMENTS

| 6,815,311 B2 | 11/2004 | Hong et al. |
| 6,969,686 B2 * | 11/2005 | Hsieh et al. .................. 438/723 |
| 2003/0020102 A1 * | 1/2003 | Gajda ........................... 257/244 |

FOREIGN PATENT DOCUMENTS

| JP | 8-17948 | 1/1996 |
| JP | 09-102586 | 4/1997 |

(Continued)

OTHER PUBLICATIONS

Jung-Dal Choi, et al., "Highly Manufacturable 1 Gb NAND Flash Using 0.12 μm Process Technology" IEDM Tech. Dig., 2001, pp. 25-28.

*Primary Examiner* — A. Sefer
*Assistant Examiner* — Dilinh P Nguyen
(74) *Attorney, Agent, or Firm* — Oblon, Spivak, McClelland, Maier & Neustadt, L.L.P.

(57) ABSTRACT

A semiconductor memory device having a memory cell region and a peripheral circuit region, and a method of manufacturing such a semiconductor memory device, are proposed, in which trench grooves are formed to be shallow in the memory cell region in order to improve the yield, and trench grooves are formed to be deep in the high voltage transistor region of the peripheral circuit region, in particular in a high voltage transistor region thereof, in order to improve the element isolation withstand voltage. A plurality of memory cell transistors having an ONO layer 15 serving as a charge accumulating insulating layer are provided in the memory cell region, where element isolation grooves 6 for these memory cell transistors are narrow and shallow. Two types of transistors, one for high voltage and the other for low voltage, having gate insulating layers 16 or 17, which are different from the ONO layer 15 in the memory cell region, are provided in the peripheral circuit region, where at least element isolation grooves 23 for high voltage transistors are wide and deep. In this way, it is possible to improve the degree of integration and yield in the memory cell region, and secure withstand voltage in the peripheral circuit region.

9 Claims, 25 Drawing Sheets

FOREIGN PATENT DOCUMENTS

| | | |
|---|---|---|
| JP | 09-139382 | 5/1997 |
| JP | 10-256399 | 9/1998 |
| JP | 2000-286349 | 10/2000 |
| JP | 2002-313967 | 10/2002 |
| JP | 2003-037251 | 2/2003 |
| JP | 2003-243543 | 8/2003 |
| KR | 2003-0002709 | 1/2003 |
| KR | 2003-0018639 | 3/2003 |

* cited by examiner

SEMICONDUCTOR MEMORY DEVICE THAT IS RESISTANT TO HIGH VOLTAGES AND A METHOD OF MANUFACTURING THE SAME

CROSS-REFERENCE TO RELATED APPLICATION

This application is a Divisional of U.S. application Ser. No. 10/954,238, filed Oct. 1, 2004, and is based upon and claims the benefit of priority from prior Japanese Patent Application No. 2003-344689, filed on Oct. 2, 2003, the entire contents of which are incorporated herein by reference.

BACKGROUND OF THE INVENTION

1. Field of the Invention

The present invention relates to a semiconductor memory device and a method of manufacturing the same. In particular, the present invention relates to a semiconductor memory device, in which non-volatile memory cells are highly densely arranged, and highly resistant to a relatively higher voltage, and a method of manufacturing such a semiconductor memory device.

2. Related Art

So-called MONOS (Metal-silicon Oxide-silicon Nitride-silicon Oxide-Semiconductor) memory cell devices, in which electric charge is trapped into silicon nitride layers, are known as one type of non-volatile semiconductor memory devices capable of being electrically written and erased. A MONOS memory cell device is capable of being written and erased at a relatively lower voltage as compared with a floating gate type memory cell device. Further, a MONOS memory cell device, which has a single-gate structure, is more suitable for miniaturization than a floating gate type memory cell device, which requires a multi-layer structure, since the gate aspect ratio of a MONOS memory cell device is smaller than that of a floating gate type memory cell device (for example, Japanese Patent Laid-Open Publication No. 2002-313967).

The semiconductor memory device shown in this reference includes a memory cell device 1 composed of MONOS transistors, and a peripheral circuit portion 2 constituting a logic circuit composed of MOS transistors, as shown in a plan view of FIG. 41. The peripheral circuit portion 2 further includes low voltage transistors having a thin gate oxide layer, and high voltage transistors having a thick gate oxide layer.

FIG. 42 shows a first example of an equivalent circuit diagram of the memory cell device 1 shown in FIG. 41. This drawing especially shows an AND structure.

As shown in FIG. 42, the memory cell device 1 is composed of transistors M01, M02, M03, . . . , M11, M22, M33, . . . , M153 which are arranged in a matrix form. Each transistor has a known MONOS structure, includes a charge accumulating layer in its floating gate, and has an EEPROM function.

A plurality of word lines WL0, WL1, WL2, WL3-WL14, and WL15 for selecting data items are connected to the memory cell device 1 having the aforementioned structure. The word line WL0 is connected to the control gates of the transistors M01, M02, and M03, and the word line WL1 is connected to the control gates of the transistors M11, M12, and M13. The rest of the word lines (up to WL15) are connected to the control gates of the corresponding transistors in the same manner.

The transistors M01, M11, and M21-M151 are connected in parallel with each other. One end (drain side) of each of these transistors is connected to a bit line BL1, which serves as a data transmitting line, via a selection transistor SS1, and the other end (source side) is connected to a common source line SL via a selection transistor GS1. Similarly, the transistors M02, M12, M22-M152 are connected in parallel with each other, one end is connected to a bit line BL2 via a selection transistor SS2, and the other end is connected to the common source line SL via a selection transistor GS2. The same applies to the transistors M03, M13, and M23-M153.

The memory cell device 1, which is of so-called AND type, is formed with such a structure. Since the operation of such a memory cell device is well known, the explanation thereof is omitted.

FIG. 43 shows a second example of an equivalent circuit diagram of the memory cell device 1 shown in FIG. 1. This drawing especially shows a NOR type structure.

As shown in FIG. 43, the memory cell device 1 is composed of transistors M01, M02, . . . , M11, M12, . . . , and M22 arranged in a matrix form. Each transistor has a known MONOS structure, includes a charge accumulating layer in its floating gate, and has an EEPROM function.

A plurality of word lines WL0, WL1, WL2, . . . serving as data selecting lines, are connected to the memory cell device 1 having the aforementioned basic structure. The word line WL0 is connected to the control gates of the transistor M01 and M02, and the word line WL1 is connected to the control gates of the transistors M11 and M12. The rest of the word lines are connected to the control gates of the corresponding transistors in the same manner.

One end (drain side) of each of the transistors M01, M11, and M21 is connected to a bit line BL1, which serves as a data transmitting line, and the other end (source side) is connected to a common source line SL.

The memory cell device 1, which is of so-called NOR type, is formed with such a structure. Since the operation of such a memory cell device is well known, the explanation thereof is omitted.

FIG. 44 shows a third example of an equivalent circuit diagram of the memory cell device shown in FIG. 41. In particular, this drawing shows the structure of a virtual ground array type memory cell device.

As shown in FIG. 44, the memory cell device 1 is composed of transistors M(m), M(m)', M(m+1), M(m+1)', . . . . Each transistor has a known MONOS structure, includes a charge accumulating layer in its floating gate, and has an EEPROM function.

A plurality of word lines WL(m), WL(m+1), . . . serving as data selecting lines, are connected to the memory cell device 1 having the aforementioned basic structure. The word line WL(m) is connected to the control gates of the transistors M(m), M(m)' . . . , and the word line WL(m+1) is connected to the control gates of the transistors M(m+1), M(m+1)', . . . .

The transistors M(m) and M(m+1), or M(m)' and M(m+1)' are arranged in parallel with each other. One end (drain side) of each transistor is connected to a bit line BL(n), which serves as a data transmitting line, via a selection transistor SS2, and the other end (source side) is connected to a bit line BL(n+1) via a selection transistor SS1 or SS3.

The memory cell device 1, which is of so-called virtual ground array type, is formed with such a structure. Since the operation of such a memory cell device is well known, the explanation thereof is omitted.

FIG. 45 shows a fourth example of an equivalent circuit diagram of the memory cell device shown in FIG. 41. In particular, this drawing shows the structure of the memory cell device 1 employing known NAND type EEPROM.

As shown in FIG. 45, MOS transistors M0, M1, M2, M3, . . . , M14, and M15 constituting one bundle of the memory cell device 1 are connected in series. Each transistor has a known MONOS structure, and has a non-volatile memory function obtained by MIS transistors having charge accumulating electrodes. The gate electrode, i.e., control gate, of each transistor is connected to word lines, i.e., data selecting lines, WL0-WL15. Further, a well potential Well is applied to the back gates of the transistors M0-M15.

The transistor M0, which is located at one end of the series-connected transistors M0-M15, is connected to a bit line BL via a selection transistor S1. The transistor M15, which is located at the other end, is connected to a source line SL via a selection transistor S2. The gate of the selection transistor S1 is connected to a SSL signal line, and the gate of the selection transistor S2 is connected to a GSL signal line.

The SSL signal line and the GSL signal line, which are block selecting lines, are connected to the memory cell device 1. At least one block selecting line is necessary for one block. Such a block selecting line is arranged in the same direction of the data selecting lines WL0-WL15 for the purpose of, e.g., higher integration.

A so-called NAND cell block is formed with such a structure. Since the operation of such a NAND cell block is well known, the explanation thereof is omitted.

FIG. 46 shows a partial plan view pattern of a semiconductor memory device including a memory cell device 1 having the structure shown in FIG. 45. In order to help easy understanding of the cell structure, the drawing shows only the portions under the control gate electrodes.

As can be understood from FIG. 46, the memory cell device 1 includes a plurality of bit lines BL extending in the vertical direction in the drawing. A plurality of word lines WL0-WL15 extending in the horizontal direction in the drawing are formed under the bit lines BL viewing in the thickness direction. An element isolation region 7 is formed between adjacent two word lines, except for the portions under the bit lines BL so as to isolate source and drain regions 8. Bit line contacts 4 are formed on the source and drain regions 8 of the bit lines BL which are adjacent to the SSL signal line. Source line contacts 3 are formed in regions of the bit line BL which are adjacent to the GSL signal line.

FIG. 47 shows sectional views of a conventional semiconductor memory device, in which (A) shows a sectional view taken along line A-A' of FIG. 46, (B) shows a sectional view taken along line B-B' of FIGS. 46, and (C) and 47(D) show sectional views of the peripheral circuit portion 2 of FIG. 41. The section (A) corresponds to the gate portion of the memory cell device 1, the section (B) corresponds to the element isolating portion of the memory cell device 1, the section (C) corresponds to a low voltage transistor portion of the peripheral circuit portion 2, and the section (D) corresponds to a high voltage transistor portion of the peripheral circuit portion 2.

As shown in the sections (A) and (B) of FIG. 47, in the region of memory cell device 1, an n-type well 10 is formed on a p-type substrate 9, and a p-type well 11 containing an impurity, e.g., boron or indium, at a concentration of $10^{14}$-$10^{19}$ (cm$^{-3}$) is formed on the n-type well 10. That is, a substrate 26 of the region of the memory cell device 1 is constituted by forming the n-type well 10 and the p-type well 11 on the p-type substrate 9.

In the region of the memory cell device 1, a tunnel insulating layer 12 serving as a first insulating layer and formed of a silicon oxide layer or an oxynitride layer having a thickness of, e.g., 0.5-10 nm, is formed in a region sandwiched by the source and drain regions 8 of the substrate 26.

Furthermore, a charge accumulating layer 13 of, e.g., a silicon nitride layer, having a thickness of 3-50 nm is formed on the tunnel insulating layer 12.

A block insulating layer 14 of, e.g., a silicon oxide layer or an oxynitride layer, is formed on the charge accumulating layer 13.

Thus, an ONO layer 15 composed of a laminated structure including the tunnel insulating layer 12, the charge accumulating layer 13, and the block insulating layer 14 is formed.

Subsequently, a first gate electrode 18 of a polycrystalline silicon layer is formed on the ONO layer 15, the impurity concentration, e.g., the phosphorus concentration, of the first gate electrode 18 being $1\times10^{19}$-$1\times10^{21}$ (cm$^{-3}$).

A metal lining layer of, e.g., WSi, NiSi, MoSi, TiSi, CoSi, etc. having a thickness of 1-500 nm is formed on the first gate electrode 18. The metal lining layer serves as a second gate electrode 19.

Then, a mask insulating layer 20 of a silicon oxide layer or a silicon nitride layer having a thickness of 10-300 nm is formed on the second gate electrode 19.

In the gate region thus formed, a sidewall insulating layer 37 is formed at the sidewall of each transistor.

Furthermore, a barrier insulating layer 21 and an interlayer insulating layer 22 are formed thereon, and a bit line BL is arranged on the interlayer insulating layer 22. A bit contact 4 connects the bit line BL and the source and drain region 8.

In the region of memory cell device 1, the p-type well 11 is isolated from the p-type substrate 9 by means of the n-type well 10. Accordingly, it is possible to apply a voltage to the p-type well 11 independently of the p-type substrate 9. Such a structure is preferable in order to decrease the load of the booster circuit at the time of erasing memory cells, thereby reducing the power consumption.

As shown in the section (C) of FIG. 47, in the low voltage transistor region (LV region) of the peripheral circuit portion 2, the substrate 26 is composed of the p-type substrate 9 and the p-type well 11 formed thereon.

In the low-voltage transistor region, a gate insulating layer 16 of a silicon oxide layer or an oxynitride layer having a thickness of, e.g., 0.5-10 nm is formed in a region sandwiched by the source and drain regions 8 of the substrate 26. A first gate electrode 18 of polycrystalline silicon layer having a thickness of 10-500 nm is formed on the gate insulating layer 16.

A metal lining layer of, e.g., WSi, NiSi, MoSi, TiSi, CoSi, etc., having a thickness of 1-500 nm is formed on the first gate electrode 18, thereby forming a second gate electrode 19.

Subsequently, a mask insulating layer 20 of a silicon oxide layer or a silicon nitride layer having a thickness of 10-300 nm is formed on the second gate electrode 19.

A sidewall insulating layer 37 is formed at the sidewall of each transistor thus formed.

Furthermore, a barrier insulating layer 21 and an interlayer insulating layer 22 are formed thereon, and a signal line 24 is arranged on the interlayer insulating layer 22. A contact 25 connects the signal line 24 and the source and drain region 8.

As shown in the section (D) of FIG. 47, in the high voltage transistor region (HV region), a gate insulating layer 17 of a silicon oxide layer or an oxynitride layer having a thickness of, e.g., 10-50 nm is formed in a region sandwiched by the source and drain regions 8 on the p-type substrate 9. A first gate electrode 18 of polycrystalline silicon layer having a thickness of 10-500 nm is formed on the gate insulating layer 17.

A metal lining layer of, e.g., WSi, NiSi, MoSi, TiSi, CoSi, etc., having a thickness of 1-500 nm is formed on the first gate electrode 18, thereby forming a second gate electrode 19.

Subsequently, a mask insulating layer 20 of a silicon oxide layer or a silicon nitride layer having a thickness of 10-300 nm is formed on the second gate electrode 19.

A sidewall insulating layer 37 is formed at the sidewall of each transistor thus formed.

Furthermore, a barrier insulating layer 21 and an interlayer insulating layer 22 are formed thereon, and a signal line 24 is arranged on the interlayer insulating layer 22. A contact 25 connects the signal line 24 and the source and drain region 8.

The gate insulating layer 17 in the high voltage transistor region is thicker than the gate insulating layer 16 of the low voltage transistor region in order to improve the withstand voltage.

As shown in the sections (B), (C), and (D) of FIG. 47, STI grooves (trench grooves) serving as element isolation grooves 6 and 23 are formed in order to isolate elements in the element isolation region of the memory cell device 1, and the low voltage transistor regions and the high voltage transistor region of the peripheral circuit portion 2.

Furthermore, a p-type region 27 including an impurity is formed at the bottom of each element isolation groove 23 in the high voltage transistor region, as shown in the section (D) of FIG. 47. It is preferable that the impurity concentration of the p-type region 27 is higher than that of the p-type substrate 9 in order to improve the element isolation withstand voltage.

As is apparent from the sections (B) and (C) of FIG. 47, a relatively deep element isolation grooves (relatively deep trench grooves) 6 are formed in the region of memory cell device 1 and the low voltage transistor region of the peripheral circuit portion 2.

As is apparent from the section (D) of FIG. 47, a relatively shallow element isolation groove (relatively shallow trench groove) 23 is formed in the high voltage transistor region of the peripheral circuit portion 2.

Next, a method of manufacturing the conventional semiconductor memory device having the aforementioned structure will be described with reference to FIGS. 48-50.

In FIGS. 48-50, the sections (A), (B), (C), and (D) correspond to those of FIG. 47.

In order to simplify the explanation, the n-type well 10 and p-type well 11 located on the p-type substrate 9, and the p-type region 27 at the bottom of the element isolation groove 23 are not shown in FIGS. 48-50. These are inclusively referred to as the substrate 26.

First, a sacrificial oxide layer (not shown) having a thickness of 5-15 nm is formed on the substrate 26. Then, if a need arises, an impurity is doped into the well and channel portions of the memory cell device 1 and the peripheral circuit portion 2, thereby forming the basic structure of the substrate 26.

Thereafter, the sacrificial oxide layer is removed, and a silicon oxide layer or a silicon nitride layer to become the gate insulating layer 17 in the high voltage transistor region of the peripheral circuit portion 2 is formed on the entire surface of the substrate 26. The thickness of the gate insulating layer 17 is adjusted to be, e.g., about 400 nm so that even if the thickness changed in the subsequent steps, the target thickness could be ultimately achieved.

Subsequently, the high voltage transistor region is covered by a resist, and the gate insulating layer 17 is removed from the memory cell region and the low voltage transistor region. As a result, the gate insulating layer 17 remains only in the high voltage transistor region.

Then, the resist is removed, and a silicon oxide layer or a silicon nitride layer having a thickness of 0.5-5 nm is formed as the tunnel insulating layer 12 of the MONOS memory cell. Thereafter, an insulating layer formed of, e.g., silicon oxide, silicon nitride, $HfO_2$, $TA_2O_5$, $TiO_2$, $Al_2O_3$, etc., is deposited, thereby forming the charge accumulating layer 13.

The block insulating layer 14 of a silicon oxide layer or a silicon nitride layer having a thickness of 1-20 nm is formed on the charge accumulating layer 13.

After the aforementioned steps, the ONO layer 15 having a three-layer structure including the tunnel insulating layer 12, the charge accumulating layer 13, and the block insulating layer 14 is formed in the memory cell region and the low voltage transistor region, and the ONO layer 15 including the gate insulating layer 17, the charge accumulating layer 13, and the block insulating layer 14 is formed in the high voltage transistor region.

Subsequently, a silicon nitride layer having a thickness of 10-500 nm, serving as a stopper layer 30 for stopping the CMP step for flattening a material embedding in the element isolation region, is deposited. Furthermore, a silicon oxide layer having a thickness of 10-500 nm is deposited on the stopper layer 30, the silicon oxide layer serving as a mask member 31 to be used for anisotropic etching of the element isolation region.

The sectional views of the respective regions as shown in FIGS. (A)-(D) of FIG. 48 can be obtained through the aforementioned steps. As is apparent from FIG. 48, the gate insulating layer 17 of the high voltage transistor region is thicker than the tunnel insulating layer 12 of the gate region, the element isolation region, and the low voltage transistor region. As a result, the upper surface of the mask material 31 in the high voltage transistor region is higher than that in the other regions.

Then, as shown in FIG. 49, a resist (not shown) is patterned by photolithography, and then anisotropic etching is performed on the mask member 31 and the stopper layer 30.

Thereafter, as shown in FIG. 50, the block insulating layer 14, the charge accumulating layer 13, the tunnel insulating layer 12, the gate insulating layer 17, and the p-type well 11 is etched up to a predetermined depth by anisotropic etching, thereby forming trenches serving as the element isolation grooves 6 of the element isolation region and the low voltage transistor region, and the element isolation groove 23 of the high voltage transistor region.

As shown in the sections (B), (C), and (D) of FIG. 50, since the gate insulating layer 17 of the high voltage transistor region is thicker than the tunnel insulating layer 12 of the element isolation region and the low voltage transistor region, the element isolation groove 23 of the high voltage transistor region is adjusted to be deeper than the element isolation grooves 6 of the element isolation regions and the low voltage transistor region so as to compensate for the difference in thickness.

The size of the transistors in the region of the memory cell device 1 shown in the sections (A)s and (B)s of FIGS. 48-50 is relatively smaller than the size of the transistors in the region of the peripheral circuit portion 2 in the sections (C)s and (D)s of FIGS. 48-50. As a result, the width of the element isolation groove 6 and the distance between adjacent two element isolation grooves 6 in the region of the memory cell device 1 are adjusted to be smaller.

In addition to the aforementioned steps, the steps as disclosed in Japanese Patent Laid-Open Publication No. 2002-313967, which was mentioned before as the prior art reference, are performed to achieve the semiconductor memory device as shown in the sectional view of FIG. 47.

Generally, it is preferable that the element isolation grooves 6 and 23 were relatively deeper in order to obtain a higher element isolation withstand voltage. That is, it is preferable that the element isolation groove 23 were as deep as possible in order to improve the withstand voltage of the high voltage transistor region. Here, the depth of an element isolation groove is defined to be the distance between the upper surface of the substrate 26 and the bottom of the element isolation groove.

In the memory region, however, since the improvement in integration and miniaturization of device is the important objective in order to achieve a mass storage device, the width of the element isolation groove 6 and the distance between the adjacent two element isolation grooves 6 should be adjusted to be reduced. At this time, in order to facilitate the manufacture and improve the yield, the element isolation grooves 6 and 23 in this region should be as shallow as possible. The reason for this is that when the trench groove is deep, the embedding aspect ratio at the time of filling up the trench groove becomes higher. As a result, it becomes difficult to achieve a good embedding characteristic.

However, in the conventional semiconductor memory device and a method of manufacturing the conventional semiconductor memory device, the element isolation groove 23 of the high voltage transistor region is shallower than the element isolation groove 6 of the memory cell region or the low voltage transistor region.

Since the conventional semiconductor memory device has the aforementioned structure, and the process of the method of manufacturing the conventional semiconductor memory device is carried out in the manner mentioned above, the following problems have been raised.

In a high voltage transistor region, the element isolation groove 23, which should be formed as deep as possible in order to obtain a higher element isolation withstand voltage, is shallower than that in other regions. Thus, it is difficult to improve the withstand voltage.

In the memory region, the element isolation groove 6, which should be formed as shallow as possible in order to improve the manufacturing yield, is formed relatively deep. Thus, it is difficult to improve the manufacturing yield.

Furthermore, in the low voltage transistor region of the peripheral circuit portion 2, it is not necessary to form the element isolation groove 6 to be deep at a sacrifice of the manufacture yield since the voltage applied to the low voltage transistor region is not so high.

Thus, the aforementioned conventional semiconductor memory device and the method of manufacturing such a semiconductor memory device have problems in that the trench grooves in the region of memory cell device 1, which should be as shallow as possible in order to improve the yield, are formed deep, and that the trench grooves in the high voltage transistor region of the peripheral circuit portion 2, which should be as deep as possible in order to improve the element isolation withstand voltage, are formed shallow.

SUMMARY OF THE INVENTION a semiconductor memory device according to a first aspect of the present invention includes: a first region including a plurality of memory cell transistors, each memory cell transistor employing a first gate insulating layer having a laminated structure including at least a charge accumulating insulating layer; and a second region including a plurality of transistors, each transistor employing a second gate insulating layer which is different from the charge accumulating insulating layer, the first and second regions being formed on a semiconductor substrate, and a depth of an element isolation trench in the first region, measured from a surface of the semiconductor substrate, being set to be shallower than a depth of an element isolation trench in the second region, measured from the surface of the semiconductor substrate.

Further, a semiconductor memory device according to a second aspect of the present invention includes: a first region including a plurality of memory cell transistors, each memory cell transistor employing a first gate insulating layer having a laminated structure including at least a charge accumulating insulating layer; a second region including a plurality of transistors, each transistor employing a second gate insulating layer which is different from the charge accumulating insulating layer; and a third region including a plurality of transistors, each transistor employing a third gate insulating layer which is different from the charge accumulating insulating layer, and is thinner than the second gate insulating layer, the first, second and third regions being formed on a semiconductor substrate, and a depth of an element isolation trench in the first region, measured from a surface of the semiconductor substrate, being set to be shallower than a depth of an element isolation trench in the second region, measured from the surface of the semiconductor substrate, and being set to be substantially the same as a depth of an element isolation trench in the third region, measured from the surface of the semiconductor substrate.

a method of manufacturing a semiconductor memory device according to a third aspect of the present invention includes: a first region including a plurality of memory cell transistors, each memory cell transistor employing a first gate insulating layer having a laminated structure including at least a charge accumulating insulating layer; and a second region including a plurality of transistors, each transistor employing a second gate insulating layer which is different from the charge accumulating insulating layer, the first and second regions being formed on a semiconductor substrate, the method comprising a step of etching the semiconductor substrate in the second region in order to form a second element isolation trench, using the charge accumulating insulating layer in the first region as an etching stopper, so that the semiconductor substrate in the first region is not etched.

a method of manufacturing a semiconductor memory device according to a fourth aspect of the present invention includes: a first region including a plurality of memory cell transistors, each memory cell transistor employing a first gate insulating layer having a laminated structure including at least a charge accumulating insulating layer; a second region including a plurality of transistors, each transistor employing a second gate insulating layer which is different from the charge accumulating insulating layer; and a third region including a plurality of transistors, each transistor employing a third gate insulating layer which is different from the charge accumulating insulating layer, and is thinner than the second gate insulating layer, the first, second and third regions being formed on a semiconductor substrate, wherein: in the first and third regions, at least the first gate insulating layer and a gate electrode formed thereon are located on the semiconductor substrate; in the second region, at least the second gate insulating layer and a gate electrode formed thereon are located on the semiconductor substrate; and the semiconductor substrate is etched in a self-aligned manner with respect to the gate electrodes, thereby forming the element isolation trenches in the first, second and third regions.

DETAILED DESCRIPTION OF THE INVENTION

Hereinafter, embodiments of the present invention will be described with reference to the accompanying drawings.

First Embodiment

Figure 1:
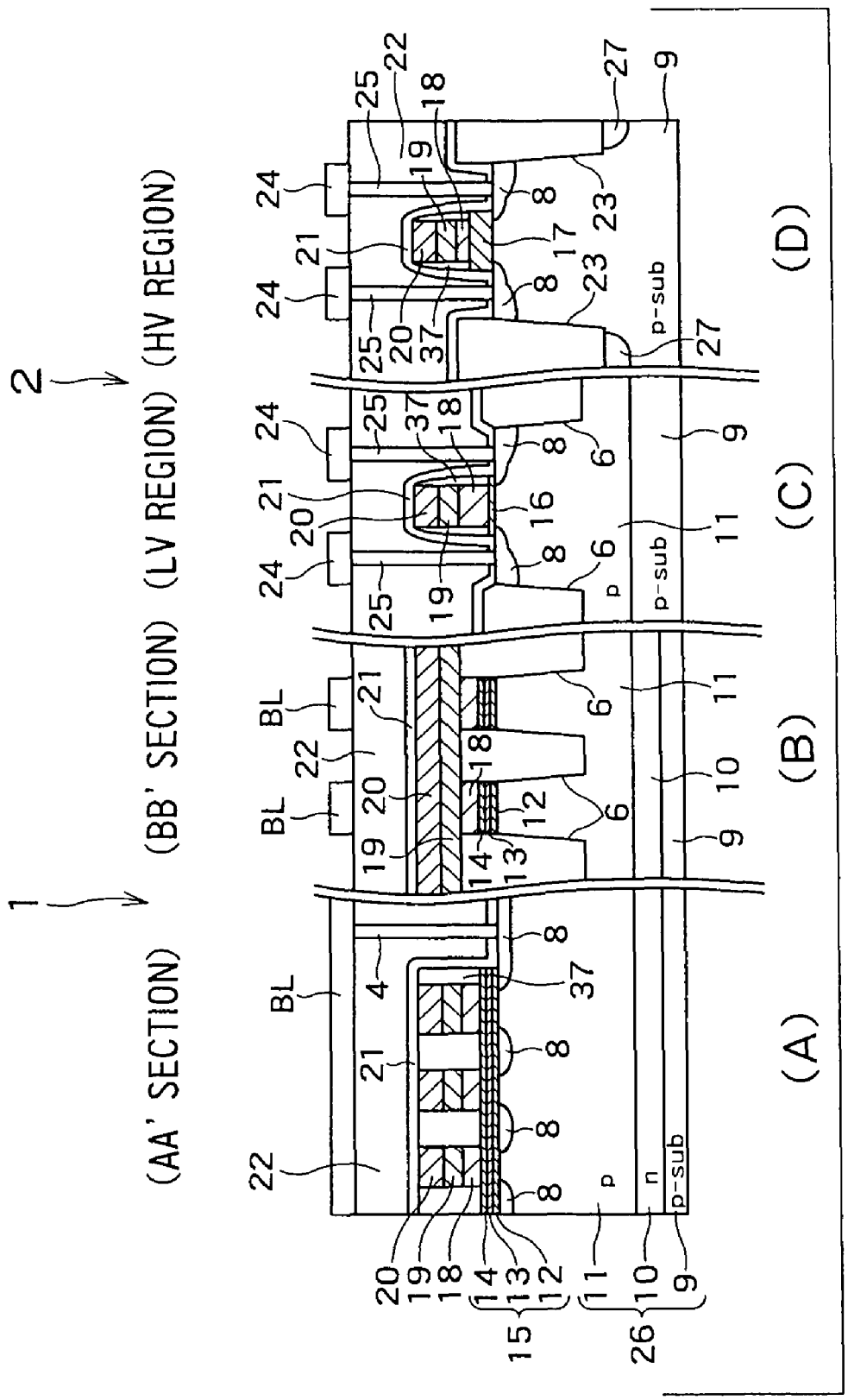
FIG. 1 is a sectional view of a semiconductor memory device according to the first embodiment of the present invention.
Figure 46:
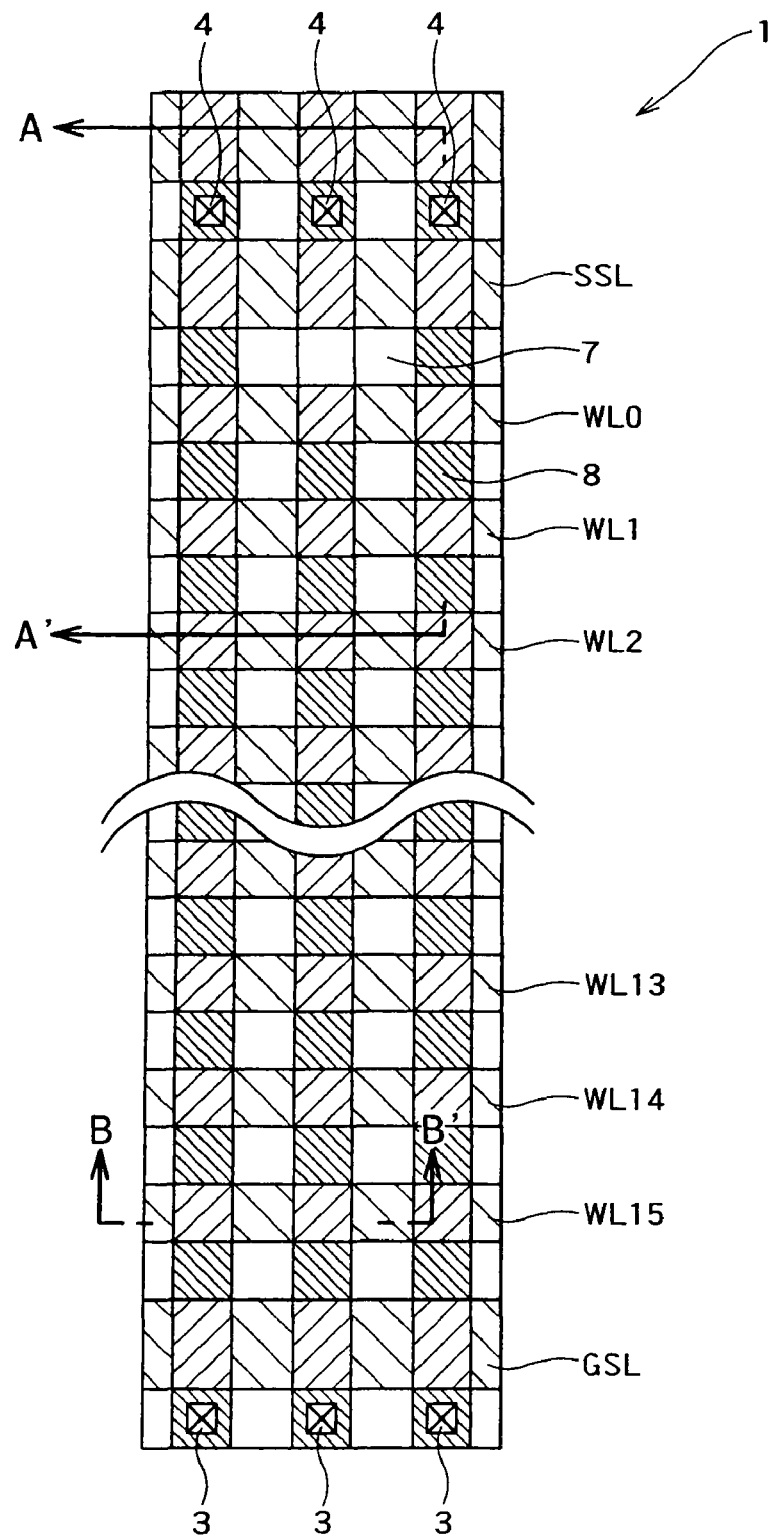
FIG. 46 is a partial plan view of a semiconductor memory device including a memory cell 1 having the structure shown in FIG. 45.

FIG. 1 shows sectional views of a semiconductor memory device according to a first embodiment of the present invention, in which (A) is a sectional view of a gate of a memory cell region (corresponding to the A-A' section of FIG. 46), (B) is a sectional view of an element isolation region in the memory cell region (corresponding to the B-B' section of FIG. 46), (C) is a sectional view of a low voltage transistor region (LV region) of a peripheral circuit portion, and (D) is a sectional view of a high voltage transistor region (HV region).

Figure 47:
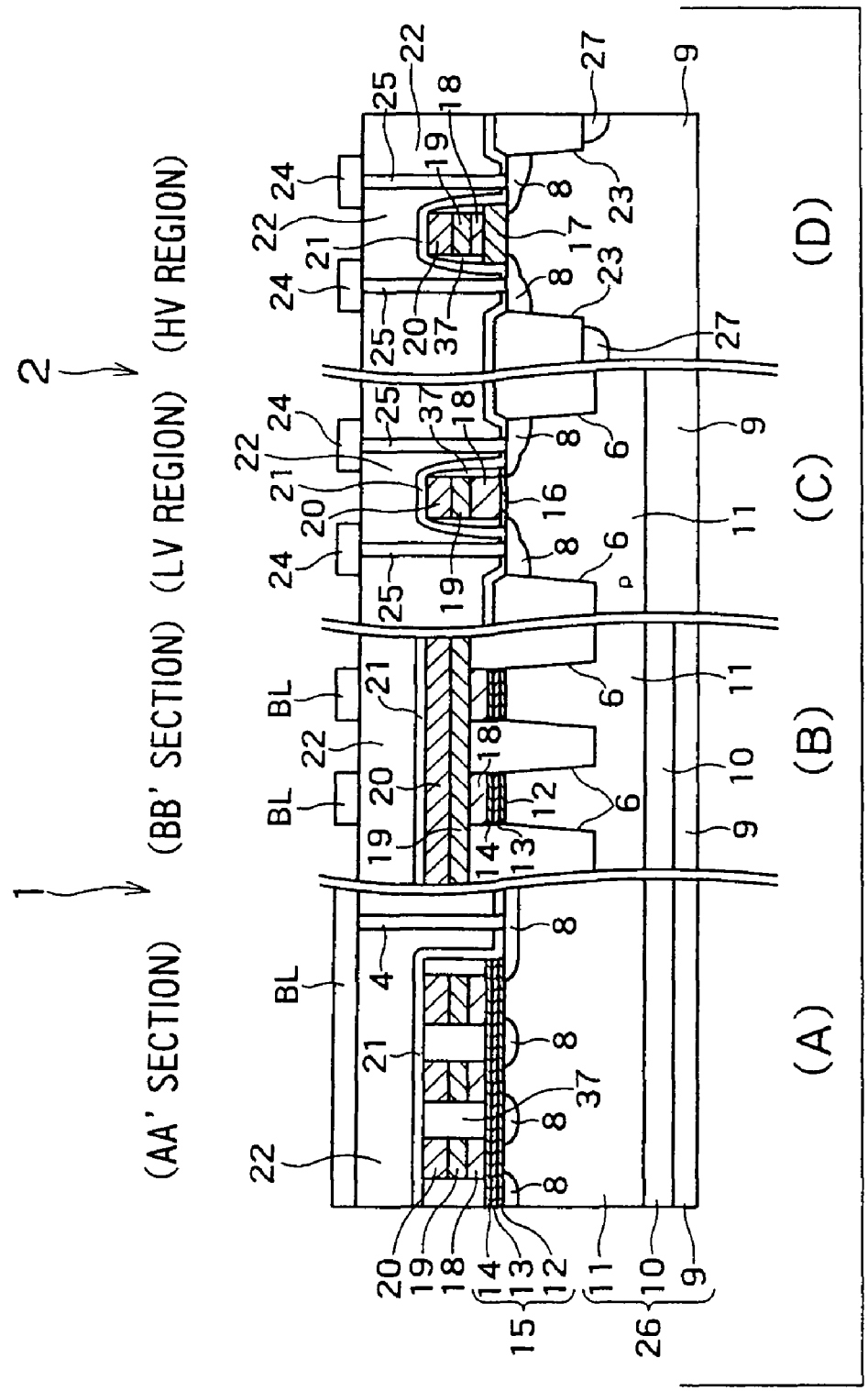
FIG. 47 is a sectional view of a conventional semiconductor memory device.
Figure 48:
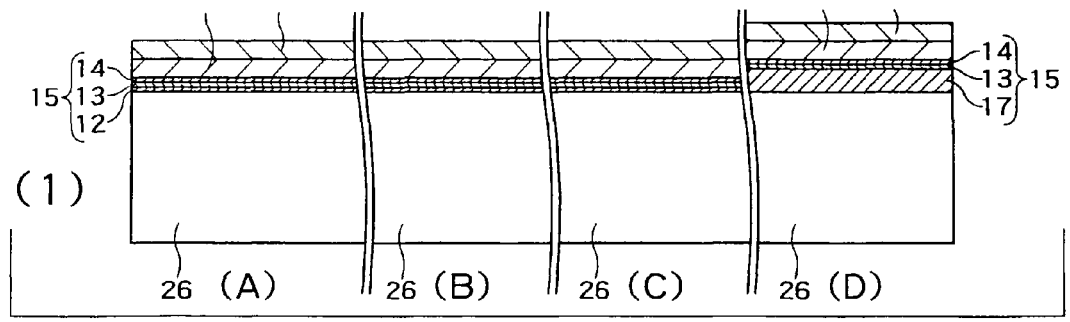
FIG. 48 is a sectional view showing one step of a method of manufacturing a conventional semiconductor memory device.
Figure 49:
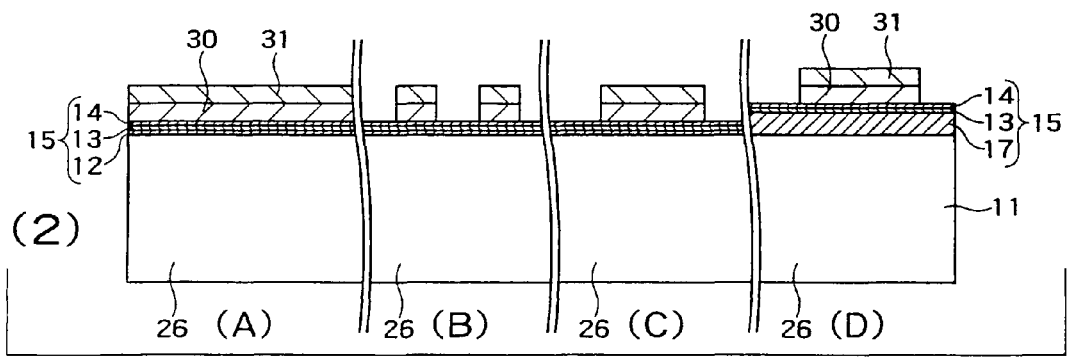
FIG. 49 is a sectional view showing one step of the method of manufacturing a conventional semiconductor memory device.
Figure 50:
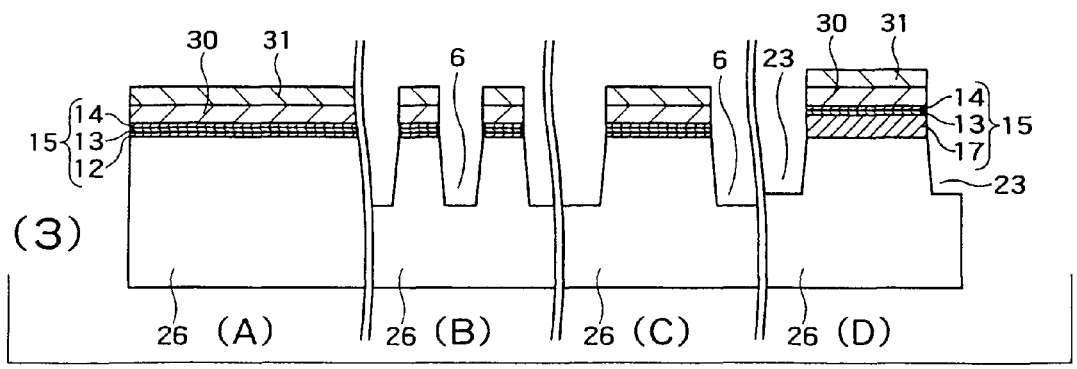
FIG. 50 is a sectional view showing one step of a method of manufacturing a conventional semiconductor memory device.

FIG. 1 differs from FIG. 47 in that the element isolation groove 23 in the high voltage transistor region of the peripheral circuit portion is deeper than the element isolation grooves 6 in the element isolation region in the memory cell region and the low voltage transistor region in the peripheral circuit portion, as shown in the sections (A), (B), and (C).

That is, as shown in the sections (B) and (C), in the region of memory cell 1 and the low voltage transistor region of the peripheral circuit portion 2, relatively shallow trench groove, i.e., relatively shallow element isolation grooves 6, are formed.

On the other hand, as shown in the section (D), in the high voltage transistor region of the peripheral circuit portion 2, relatively deep trench grooves, i.e., relatively deep element isolation grooves 23, are formed.

Thus, according to the semiconductor memory device of the first embodiment, the element isolation grooves 23 in the high voltage transistor region, which should be as deep as possible in order to obtain a higher element isolation withstand voltage, are formed to be deeper than the element isolation grooves in the other region. That is, the high voltage transistor region has a structure suitable for improving the withstand voltage.

In addition, according to the semiconductor memory device of the first embodiment, the element isolation grooves 6 in the memory region, which should be as shallow as possible in order to improve the manufacturing yield, is formed to be shallower than the element isolation grooves in the high voltage region. That is, the memory region has a structure suitable for facilitating the manufacture and for improving the yield at the time of manufacturing a highly integrated memory cell device having a large capacity.

In the peripheral circuit portion 2, the trench grooves, i.e., the element isolation grooves 6, in the low voltage transistor region are formed to be shallow since the voltage applied to this region is low. Thus, the present invention has a reasonable structure not to degrade the yield unnecessarily.

In addition, the first gate electrode 18 serving as the metal lining layer, the second gate electrode 19, and the mask insulating layer 20 of the memory cell region, the low voltage transistor region, and the high voltage transistor region, are formed to be the same layers, which helps facilitate the manufacturing process.

Thus, according to the semiconductor memory device of the first embodiment of the present invention, the trench grooves in the region of the memory cell device 1, which should be shallow in order to improve the yield, are formed to be shallow. Furthermore, the trench grooves in the high voltage transistor region of the peripheral circuit portion 2, which should be deep in order to improve the element isolation withstand voltage, are formed to be deep. Accordingly, it is possible to achieve a semiconductor memory device which is easy to manufacture, and has superior performance such as a higher yield and a higher element isolation withstand voltage.

Next, a method of manufacturing the semiconductor memory device of the first embodiment will be described with reference to FIGS. 2-23.

The sections (A), (B), (C), and (D) in FIGS. 2-23 correspond to the sections (A), (B), (C), and (D) of FIG. 1.

In order to simplify the explanation, the n-type well 10 and the p-type well 11 on the p-type substrate 9, and the p-type region at the bottom of the element isolation groove 23 are not shown, but they are inclusively referred to as the substrate 26.

First, a sacrificial oxide layer (not shown) having a thickness of 1-100 nm is formed on a p-type silicon substrate containing boron as an impurity at a concentration of $10^{14}$-$10^{19}$ (cm$^{-3}$). Then, a resist is applied thereto, and lithography is performed. Thereafter, ions such as phosphorus, arsenic, antimony, etc., are doped into the memory cell region at an acceleration energy of 30-1,500 KeV and with a dose amount of $1\times10^{11}$-$1\times10^{15}$ (cm$^{-2}$), thereby forming an n-type well in the memory cell region.

Further, boron ions are doped into the memory cell region and the low voltage transistor region with a dose amount of $1\times10^{11}$-$1\times10^{14}$ (cm$^{-2}$) and at an acceleration energy of 100-1,000 KeV, thereby forming a p-type well in the memory cell region and the low voltage transistor region.

Then, a resist is applied, and lithography is performed. Subsequently, an impurity such as boron, indium, etc., is doped into the memory cell region and the low voltage transistor region as channel ions at a does amount of $1\times10^{11}$-$1\times10^{14}$ (cm$^{-2}$).

Thereafter, the sacrificial oxide layer is removed. Then, a silicon oxide layer or an oxynitride layer having a thickness of 0.5-10 nm is formed on the substrate 26, the layer serving as the tunnel insulating layer 12 in the memory cell region of the MONOS.

Then, a silicon nitride layer having a thickness of 3-50 nm is formed thereon, the layer serving as the charge accumulating layer 13.

Subsequently, a silicon oxide layer or an oxynitride layer having a thickness of 3-30 nm is formed thereon, the layer serving as the block insulating layer 14.

After the aforementioned steps, the ONO layer 15 including the tunnel insulating layer 12, the charge accumulating layer 13, and the block insulating layer 14 is formed, the ONO layer 15 becoming the gate oxide layer.

Then, an amorphous silicon layer or a polycrystalline silicon layer having a thickness of 10-500 nm to become the first gate electrode 18 is formed on the entire surface of the ONO layer 15.

It is preferable that the silicon layer constituting the first gate electrode 18 included no impurity, but a polycrystalline silicon layer containing $1\times10^{19}$–$1\times10^{21}$ ($cm^{-3}$) of an impurity, e.g., phosphorus, can be used.

Figure 3:
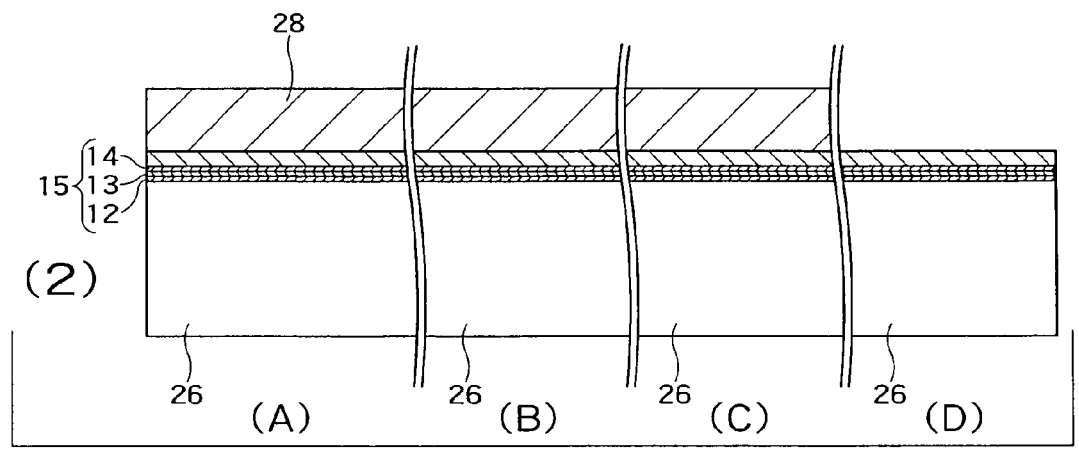
FIG. 3 is a sectional view showing one step of the method of manufacturing the semiconductor memory device according to the first embodiment.
Figure 4:
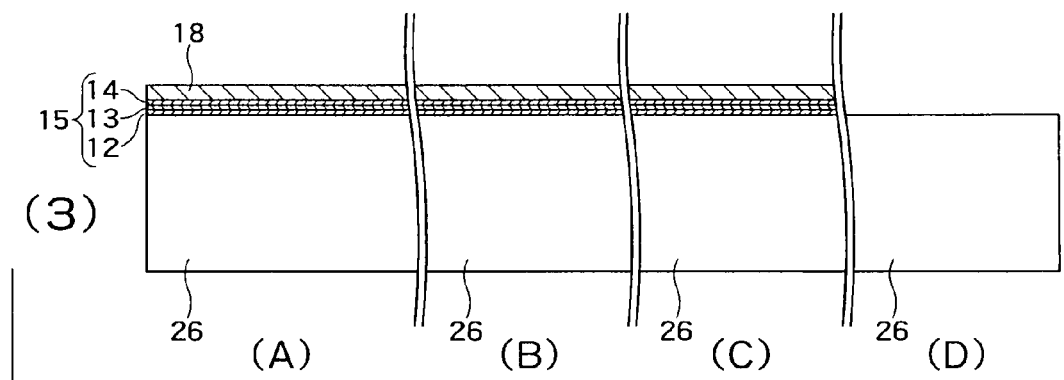
FIG. 4 is a sectional view showing one step of the method of manufacturing the semiconductor memory device according to the first embodiment.

Then, as shown in FIG. 3, a resist 28 is prepared on the surface of the workpiece except for the high voltage transistor region. Subsequently, the first gate electrode 18 and the ONO layer 15 of the high voltage transistor region is removed by lithography and isotropic or anisotropic etching, as shown in FIG. 4. After the etching step, the resist 28 is removed.

Figure 5:
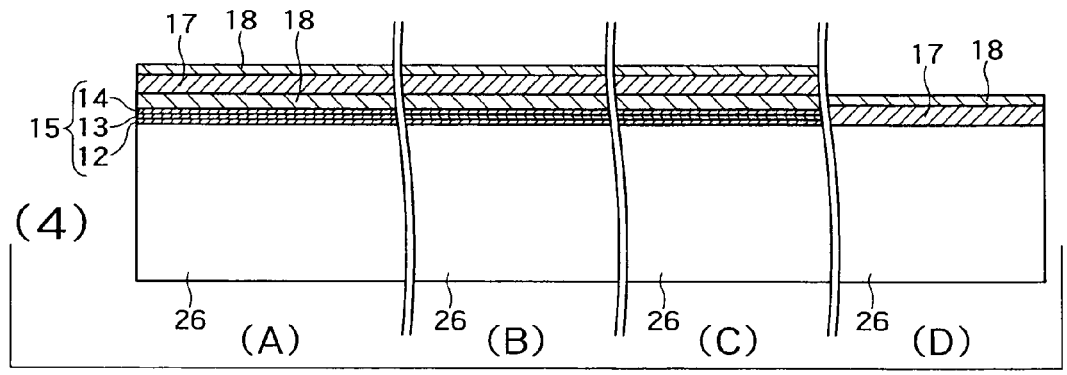
FIG. 5 is a sectional view showing one step of the method of manufacturing the semiconductor memory device according to the first embodiment.

Subsequently, as shown in FIG. 5, an oxide layer or an oxynitride layer to become the gate insulating layer 17 of the high voltage transistor region is formed so as to have a thickness of 10-500 nm. Further, a polycrystalline or amorphous silicon layer to become the first gate electrode 18 of the high voltage transistor region is formed so as to have a thickness of 10-500 nm.

The thickness of the silicon layer can be the same as that of the silicon layer deposited on the ONO layer 15. Furthermore, the height of the first gate electrode 18 previously deposited in the memory cell region and the low voltage transistor region can be the same as the height of the first gate electrode 18 newly deposited in the high voltage transistor region.

As the gate insulating layer 17 and the first gate electrode 18 are deposited on the substrate 26 in the high voltage transistor region, an oxide layer and a silicon layer are similarly deposited on the first gate electrode 18 in the memory cell region and the low voltage transistor region.

Figure 6:
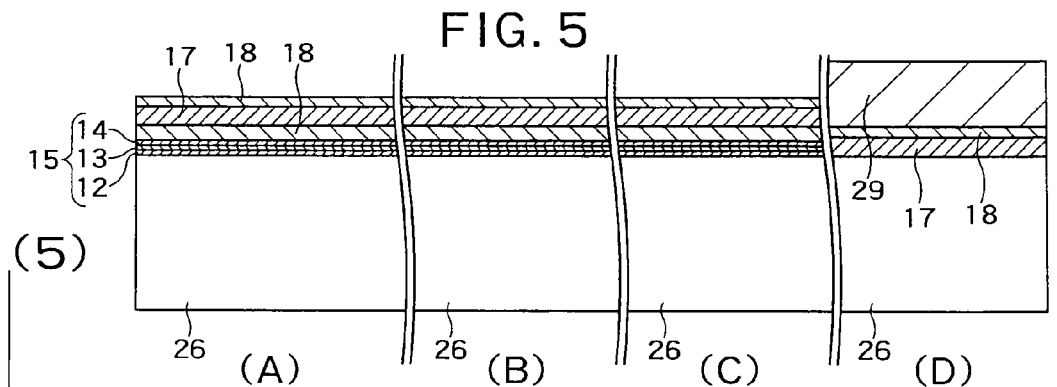
FIG. 6 is a sectional view showing one step of the method of manufacturing the semiconductor memory device according to the first embodiment.
Figure 7:
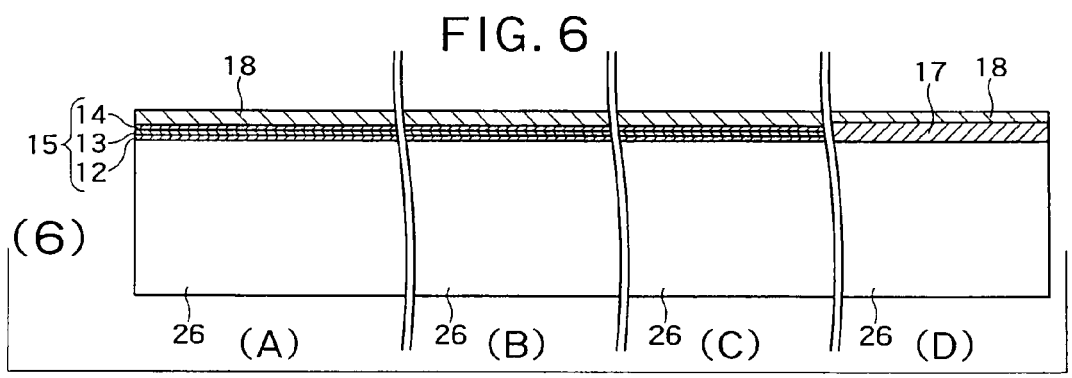
FIG. 7 is a sectional view showing one step of the method of manufacturing the semiconductor memory device according to the first embodiment.

Subsequently, a resist 29 is prepared in the high voltage transistor region, as shown in FIG. 6, and the oxide layer and the silicon layer in the memory cell region and the low voltage transistor region are removed by lithography and isotropic or anisotropic etching, as shown in FIG. 7.

Through the aforementioned steps, the structure of this embodiment can be achieved, in which the ONO layer 15 and the gate insulating layer 17 are formed in the corresponding regions, and the first gate electrode 18 is formed on both of these layers. The process of achieving such a structure is not limited to the aforementioned one. For example, first the ONO layer 15 and the gate insulating layer 17 can be formed in the relating regions, and then the first gate electrode 18 can be deposited thereon. Other ways are also acceptable as long as in the completed device, the memory cell region and the low voltage transistor region have a laminated structure including the ONO layer 15 and the first gate electrode 18, and the high voltage transistor region has a laminated structure including the gate insulating layer 17 and the first gate electrode 18.

Figure 8:
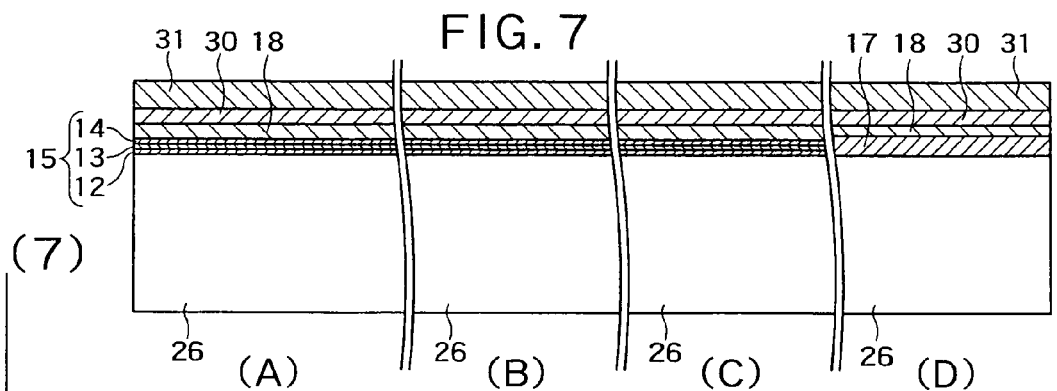
FIG. 8 is a sectional view showing one step of the method of manufacturing the semiconductor memory device according to the first embodiment.

Next, as shown in FIG. 8, the first insulating layer 30 formed of a silicon nitride layer and the second insulating layer 31 formed of a silicon oxide layer each having a thickness of 10-200 nm are deposited on the entire surface of the wafer.

Figure 9:
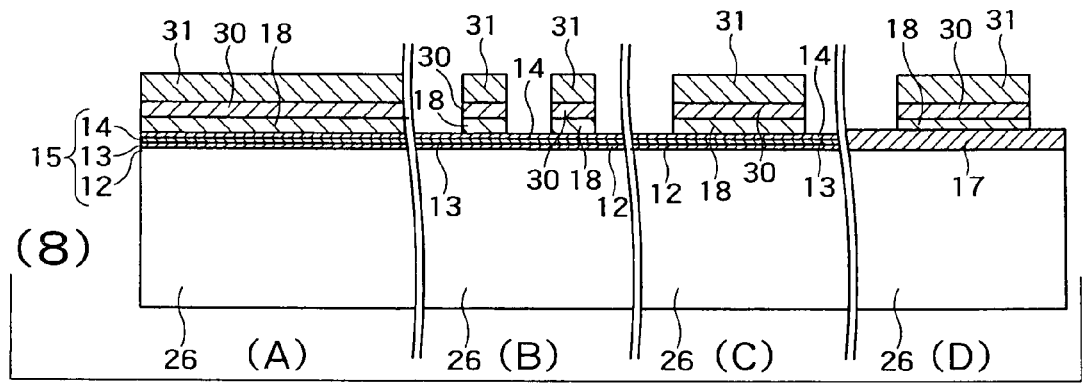
FIG. 9 is a sectional view showing one step of the method of manufacturing the semiconductor memory device according to the first embodiment.

Then, as shown in FIG. 9, lithography and anisotropic etching are performed on the first insulating layer 30, the second insulating layer 31, and the polycrystalline silicon layer to become the first gate electrode 18. The etching mask used at the time of the etching step in FIG. 9 is the mask member composed of the electrode member (18) in the memory transistor in the memory cell device 1 ((A) and (B)) and the LV region ((C)). In the HV region ((D)), the mask member composed of the electrode member (18) on the thick gate oxide layer (17) is used.

Figure 10:
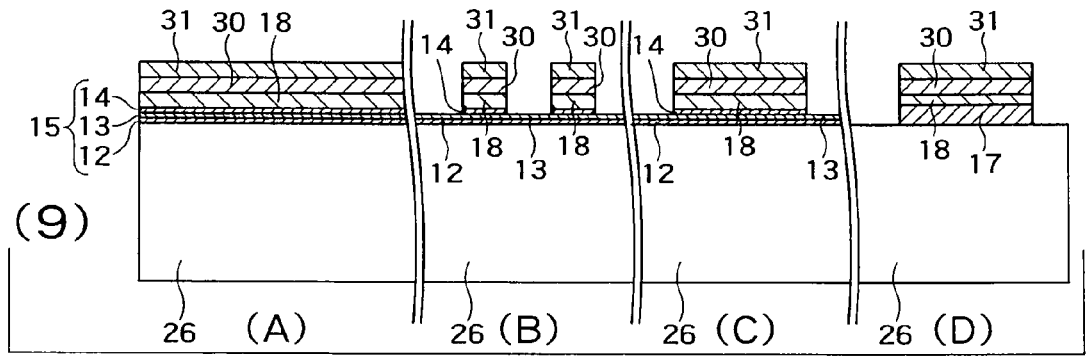
FIG. 10 is a sectional view showing one step of the method of manufacturing the semiconductor memory device according to the first embodiment.

Subsequently, as shown in FIG. 10, anisotropic etching is performed on the block insulating layer 14 in the memory cell region and the low voltage transistor region, and the gate insulating layer 17 in the high voltage transistor region, using the first insulating layer 30 and the second insulating layer 31 as masks. At this time, the charge accumulating insulating layer formed of a silicon nitride layer (charge accumulating layer 13) is left in the memory cell region and the low voltage transistor region.

Figure 11:
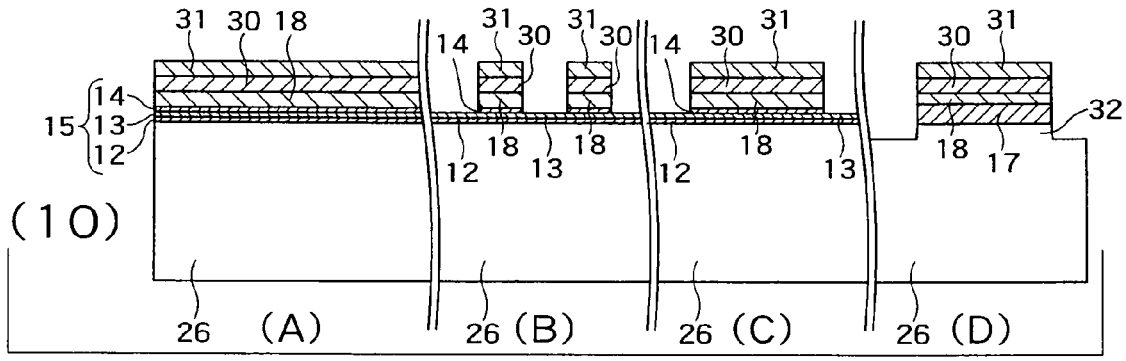
FIG. 11 is a sectional view showing one step of the method of manufacturing the semiconductor memory device according to the first embodiment.

Then, as shown in FIG. 11, anisotropic etching is performed to etch, using the first insulating layer 30 and the second insulating layer 31 as masks, the silicon substrate of the high voltage transistor region with a depth of 10-100 nm so as to a step portion 32 of the element isolation groove under an etching condition having a selectivity with respect to silicon nitride layer. It is preferable that an etching condition were chosen in which the etching rate of the substrate 26 is more than ten times that of the charge accumulating layer 13. With such an etching condition, the step portion 32 having a sufficient depth for making an element isolation groove can be formed in the high voltage transistor region without performing photolithography.

Figure 12:
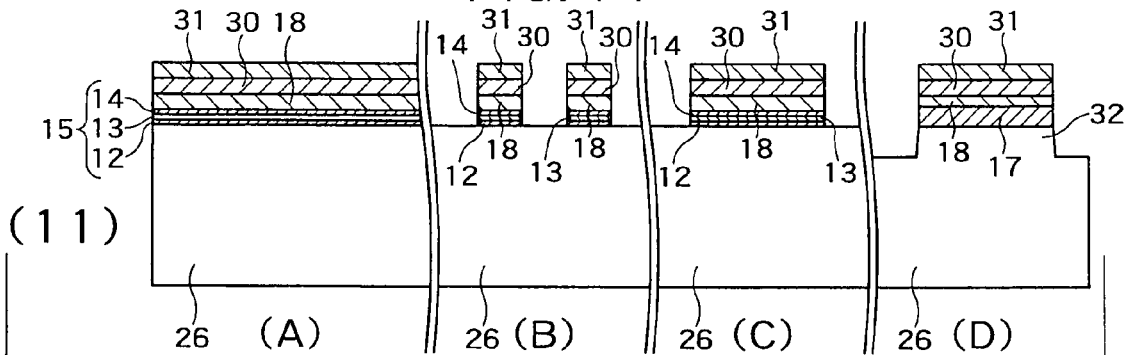
FIG. 12 is a sectional view showing one step of the method of manufacturing the semiconductor memory device according to the first embodiment.

Subsequently, as shown in FIG. 12, anisotropic etching is performed on the charge accumulating layer 13 and the tunnel insulating layer 12 in the memory cell region and the low voltage transistor region using the first insulating layer 30 and the second insulating layer 31 as masks. At this time, as an etching condition with a low selectivity with respect to the substrate 26 is employed, the substrate 26 in the high voltage transistor region is also etched. As a result, the substrate 26 is exposed in the memory cell region and the low voltage transistor region, and the step portions 32 of the element isolation grooves are further deepened by 5-50 nm in the high voltage transistor region.

Figure 13:
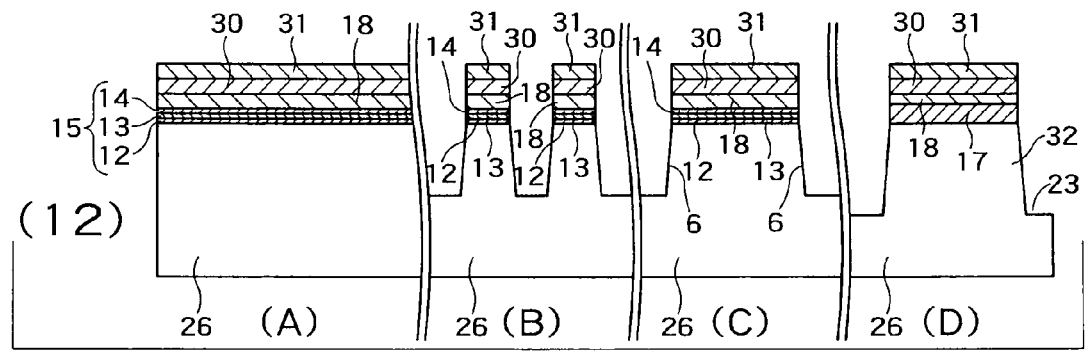
FIG. 13 is a sectional view showing one step of the method of manufacturing the semiconductor memory device according to the first embodiment.

Next, as shown in FIG. 13, anisotropic etching is performed on the substrate 26 using the first insulating layer 30 and the second insulating layer 31 as masks, thereby forming the element isolation grooves 6 having a depth of 30-500 nm in the memory cell region and the low voltage transistor region. At this time, since the step portions 32 for making element isolation grooves have been formed in the high voltage transistor region, the element isolation grooves 23, which are deeper than the element isolation grooves 6 by 10-150 nm, are formed in this region.

Figure 14:
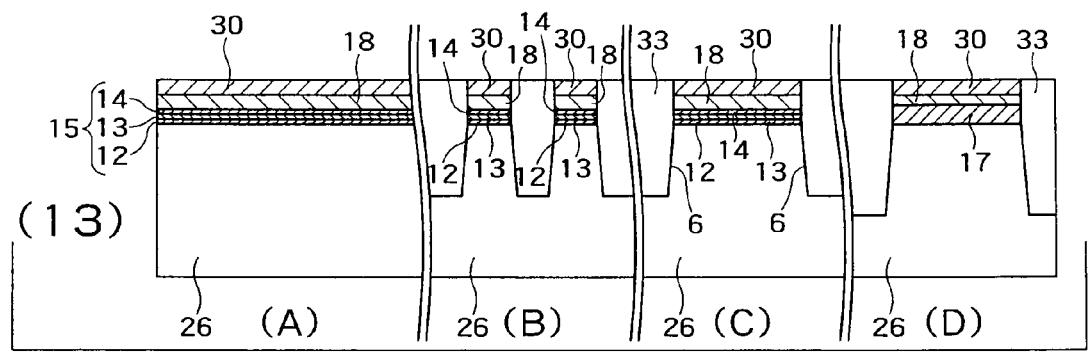
FIG. 14 is a sectional view showing one step of the method of manufacturing the semiconductor memory device according to the first embodiment.

Thereafter, as shown in FIG. 14, the element isolation grooves 6 and 23 are filled with an insulating material 33, such as a silicon oxide layer, and the filled material is flattened by CMP (Chemical Mechanical Polishing), etc. At this time, the second insulating layer 31 is removed by CMP, and the first insulating layer 30 works as an etching stopper in the CMP step.

If the height of the fist gate electrode 18 formed on the ONO layer 15 in the memory cell region and the low voltage transistor region and the height of the first gate electrode 18 formed on the gate insulating layer 17 in the high voltage transistor region were adjusted to be the same, as shown in FIG. 5, even if the depth of the element isolation grooves 6 and 23 varied for each region, the height of the first insulating layer 30 serving as the etching stopper would become the same for all of the memory cell region, the low voltage transistor region, and the high voltage transistor region. Accordingly, the CMP step could be facilitated, thereby improving the yield.

Figure 15:
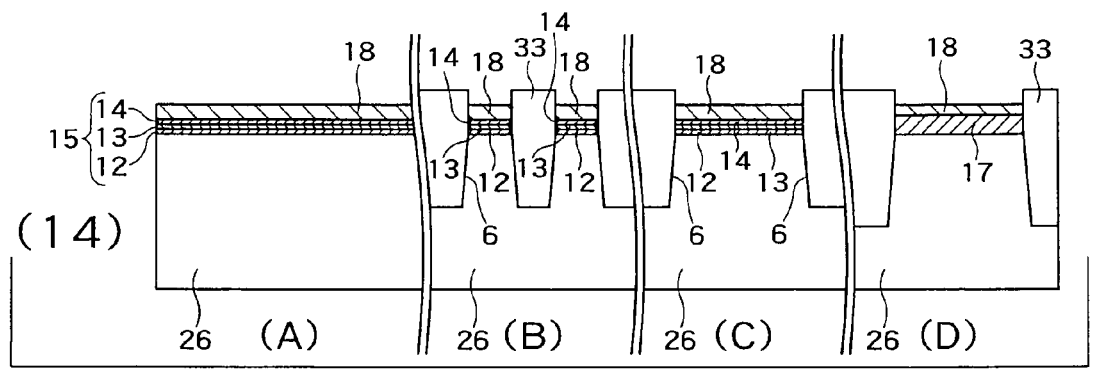
FIG. 15 is a sectional view showing one step of the method of manufacturing the semiconductor memory device according to the first embodiment.

Then, as shown in FIG. 15, the first insulating layer 30 is removed by wet etching, etc., thereby exposing the first gate electrode 18 in all of the memory cell region, the low voltage transistor region, and the high voltage transistor region.

Figure 16:
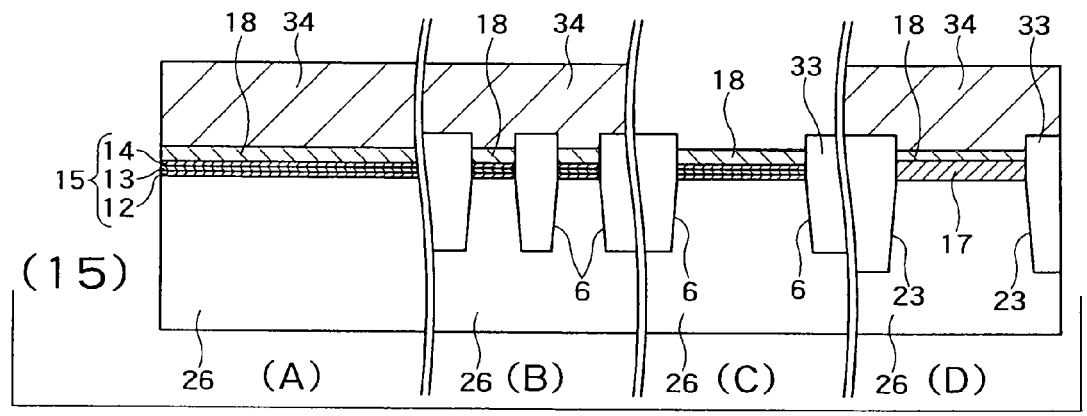
FIG. 16 is a sectional view showing one step of the method of manufacturing the semiconductor memory device according to the first embodiment.

Thereafter, as shown in FIG. 16, the memory cell region and the high voltage transistor region are covered by a resist 34 by photolithography, leaving an opening over the low voltage transistor region.

Figure 17:
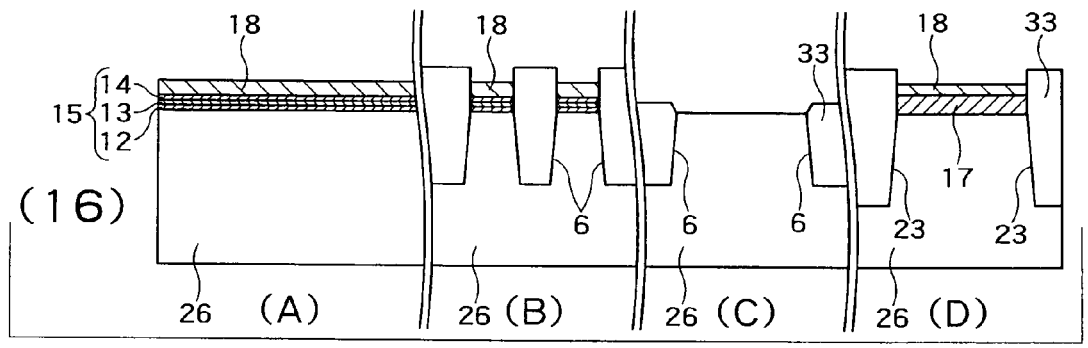
FIG. 17 is a sectional view showing one step of the method of manufacturing the semiconductor memory device according to the first embodiment.

Thereafter, as shown in FIG. 17, the first gate electrode 18 and the ONO layer 15 in the low voltage transistor region are removed by anisotropic etching or isotropic etching, and then the resist 34 is removed. At this time, the upper portion of the insulating material 33, which is filled in the element isolation grooves 6 in the low voltage transistor region, is also etched. As a result, the height of the upper edge of the element isolation grooves 6 in the low voltage transistor region becomes lower than the height of the upper edge of the element isolation grooves 6 and 23 of the memory cell region and the high voltage transistor region. Here, the height of element isolation grooves is defined by the distance between the upper surface of the substrate 26 and the upper edge of the insulating material 33 filled in the element isolation grooves.

Figure 18:
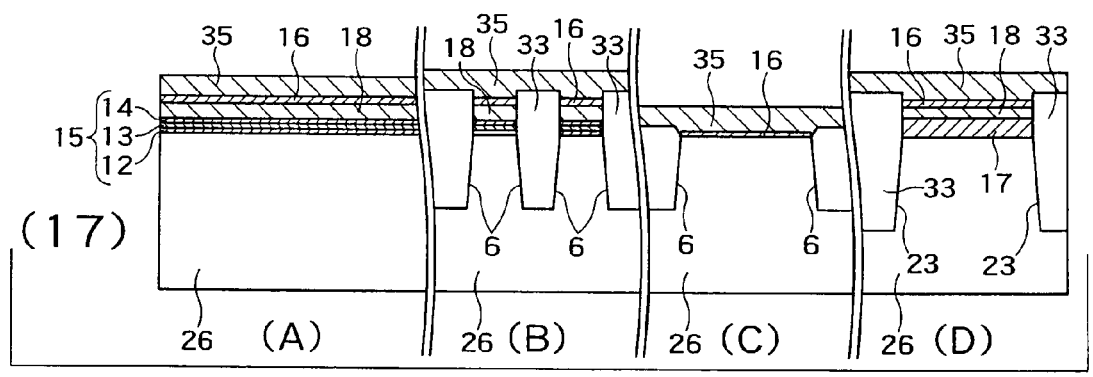
FIG. 18 is a sectional view showing one step of the method of manufacturing the semiconductor memory device according to the first embodiment.

Subsequently, as shown in FIG. 18, a gate insulating layer 16 for the low voltage transistor region, formed of a silicon oxide layer having a thickness of 0.5-15 nm, is formed. Then, a gate electrode member 35 formed of a polycrystalline silicon layer having a thickness of 10-500 nm is deposited thereon. At this time, the gate insulating layer 16 and the gate electrode member 35 are also formed in the memory cell region and the high voltage transistor region.

Figure 19:
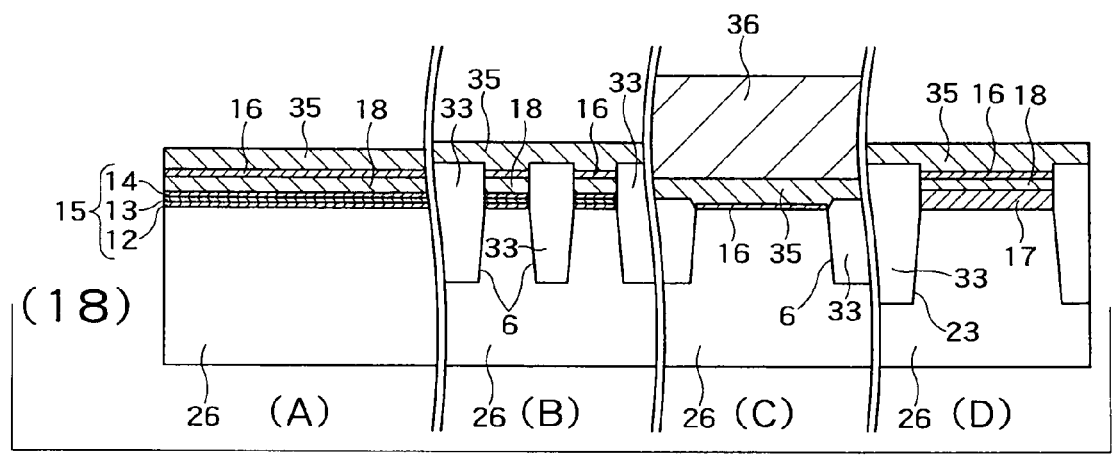
FIG. 19 is a sectional view showing one step of the method of manufacturing the semiconductor memory device according to the first embodiment.
Figure 20:
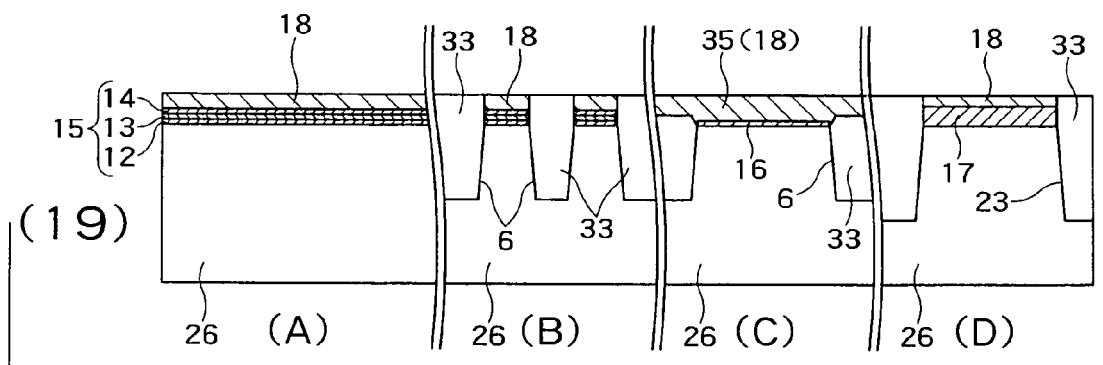
FIG. 20 is a sectional view showing one step of the method of manufacturing the semiconductor memory device according to the first embodiment.

Next, as shown in FIG. 19, a resist 36 is deposited so as to cover the low voltage transistor region by photolithography, and as shown in FIG. 20, the gate insulating layer 16 and the gate electrode member 35 formed in the memory cell region and the high voltage transistor region are removed.

In the memory cell region and the high voltage transistor region, the first gate electrodes 18 are not placed on the insulating members 33 of the element isolation grooves 6 and 23, while in the low voltage transistor region, the gate electrode member 35 is placed on the insulating members 33 of the element isolation grooves 6. The reason for this is that only in the low voltage transistor region, the gate insulating layer 16 and the gate electrode member 35 are formed after the insulating member 33 is filled in the element isolation grooves 6. The gate electrode member 35 formed in this manner serves as the first gate electrode 18 in the low voltage transistor region.

The thickness of the gate electrode member 35 in the low voltage transistor region can be the same as the thickness of the first gate electrode 18 in the memory cell region and the high voltage transistor region. Further, the upper surface of the first gate electrode 18 can be at the same height as that of the gate electrode member 35. In the former case, since the etching amount for etching the first gate electrode 18 and the gate electrode member 35 becomes the same both in the case of the low voltage transistor region and in the case of the memory cell region and the high voltage transistor region, the processing margin at the time of processing the gate can be improved. In the latter case, since the height of the gate electrode of a transistor in the low voltage transistor region, viewing from the surface of the substrate 26, becomes the same as that in the memory cell region and the high voltage transistor region, fluctuations in height of the interlayer insulating layer become smaller, thereby improving the yield of contact wiring.

Hereinafter, the gate electrode member 35 will be referred to as the first gate electrode 18 of the low voltage transistor region.

Figure 21:
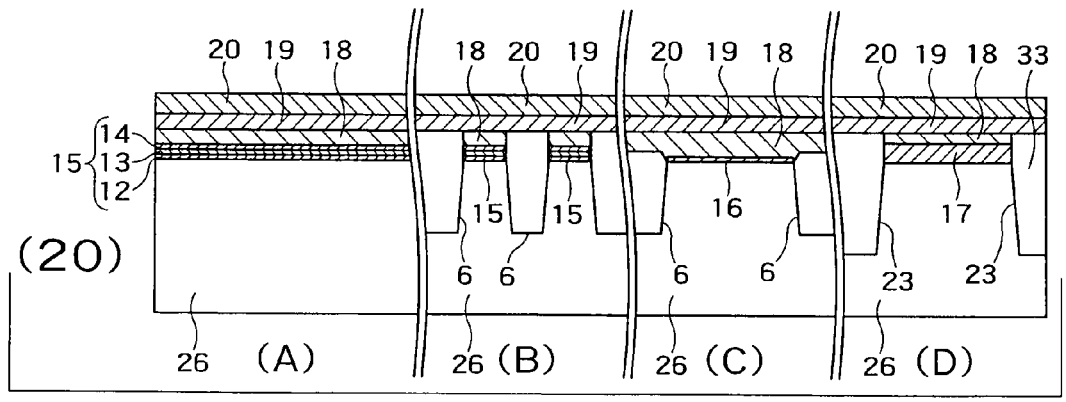
FIG. 21 is a sectional view showing one step of the method of manufacturing the semiconductor memory device according to the first embodiment.

Next, as shown in FIG. 21, a metal lining layer of, e.g., WSi, NiSi, MoSi, TiSi, CoSi, etc., having a thickness of 1-500 nm, is formed, the metal lining layer serving as the second gate electrode 19. Then, a mask insulating layer 20 of a silicon oxide layer or a silicon nitride layer having a thickness of 10-300 nm is formed thereon.

After the aforementioned steps, the second gate electrode 19 directly contacts the insulating members 33 of the element isolation grooves 6 and 23 in the memory cell region and the high voltage transistor region, while the second gate electrode 19 is formed over the insulating materials 33 of the element isolation grooves 6 with the first gate electrode 18 located therebetween in the low voltage transistor region.

Figure 22:
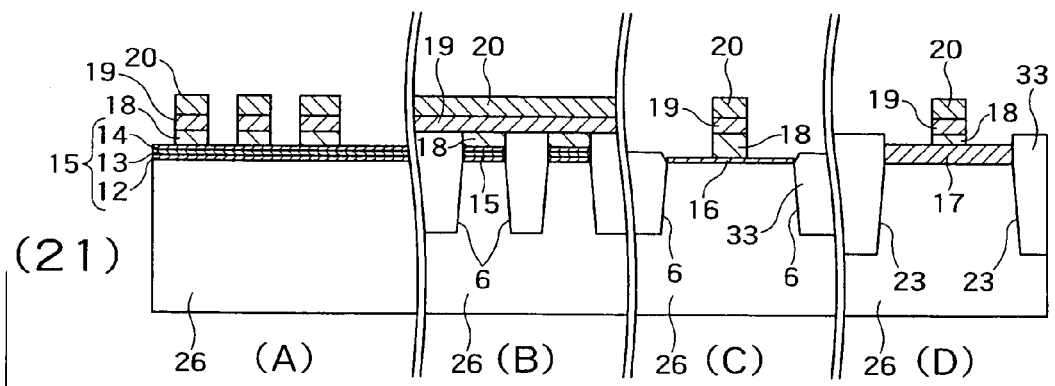
FIG. 22 is a sectional view showing one step of the method of manufacturing the semiconductor memory device according to the first embodiment.

Then, as shown in FIG. 22, photolithography and anisotropic etching is performed on the first gate electrode 18, the second gate electrode 19, and the mask insulating layer 20, thereby forming the gate structure of each transistor.

Figure 23:
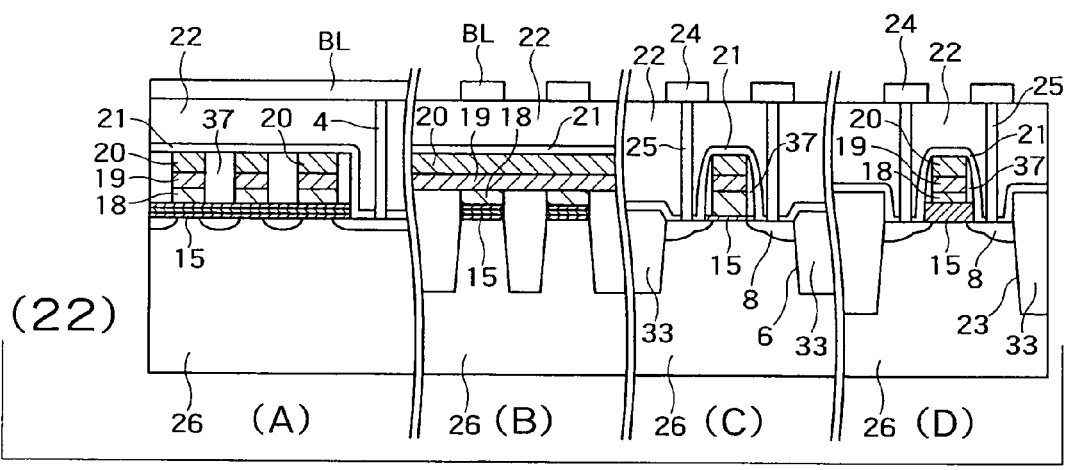
FIG. 23 is a sectional view showing one step of the method of manufacturing the semiconductor memory device according to the first embodiment.

Subsequently, as shown in FIG. 23, the sidewall insulating layer 37 and the source and drain regions 8 are formed, and then each transistor is covered by the barrier insulating layer 21. Then, the interlayer insulating layer 22 is deposited thereon. Thereafter, the interlayer insulating layer 22 is flattened. Then, the bit line contacts 4 in the memory cell region, and the contacts 25 in the low voltage transistor region and the high voltage transistor region are formed. Thereafter, the metal bit lines BL in the memory cell region and the metal signal lines 24 in the low voltage transistor region and the high voltage transistor region are formed so as to connect to the corresponding contacts.

After the aforementioned steps, other steps, e.g., a step for depositing a passivation layer, are performed to complete the manufacture of a non-volatile semiconductor memory device.

In the aforementioned steps as shown in FIGS. 20 and 21, the first gate electrode 18 (35) is directly located on the insulating members 33, which fills up the element isolation grooves 6, only in the low voltage transistor region. The effect of such a structure will be described below.

Figure 24:
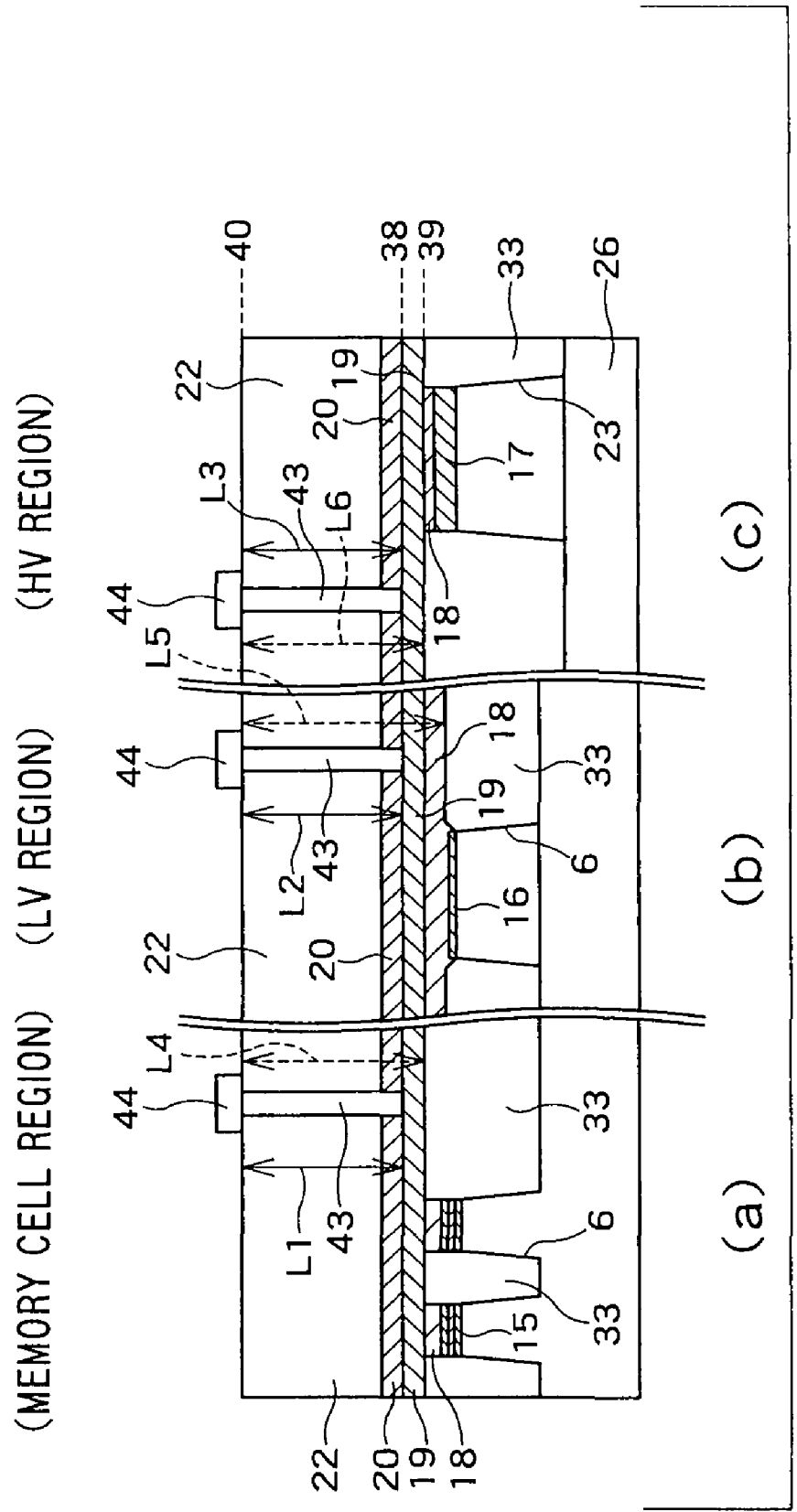
FIG. 24 is a sectional view for explaining the characteristic feature in the method of manufacturing the semiconductor memory device according to the first embodiment.

FIG. 24 shows sectional views of the gate contact plugs in the respective transistor regions, in which (a) shows the memory cell region, (b) shows the low voltage transistor region, and (c) shows the high voltage transistor region.

As shown in FIG. 24, wiring lines from the gates are established by the contact plugs 43, which connect to the gate wiring lines 44 formed on the interlayer insulating layer 22. In FIG. 24, the interface between the first gate electrode 18 and the second gate electrode 19 is referred to as the element isolation upper surface 39, the interface between the second gate electrode 19 and the mask insulating layer 20 is referred to as the gate electrode upper surface 38, and the upper surface of the interlayer insulating layer 22 is referred to as the interlayer upper surface 40. In the memory cell region, the distance between the interlayer upper surface 40 and the gate electrode upper surface 38, i.e., the gate contact etching depth, is denoted by L1, and the distance between the interlayer upper surface 40 and the element isolation upper surface 39 is denoted by L4. In the low voltage transistor region, the distance between the interlayer dielectric upper surface 40 and the gate electrode upper surface is denoted by L2, and the distance between the interlayer upper surface 40 and the element isolation upper surface 39 is denoted by L5. In the high voltage transistor region, the distance between the interlayer upper surface 40 and the gate electrode upper surface 38 is denoted by L3, and the distance between the interlayer upper surface 40 and the element isolation upper surface 39 is denoted by L6.

The gate contact plug 43 connects to the second gate electrode 19 in the element isolation region of each transistor. Accordingly, the etching amount at the time of forming a contact hole for the gate contact plug 43 represents the distances L1, L2, and L3 between the interlayer dielectric upper surface 40 and the element isolation upper surface 39.

At this stage, since the element isolation upper surface 39 in the low voltage transistor region is located lower than the element isolation upper surface 39 in the other regions, the distance L5 between the element isolation upper surface 39 and the interlayer upper surface 40 in this region is longer than the distances L4 and L6 in the other regions. However, since the thickness of the first gate electrode 18 in the low voltage transistor region compensate for the difference in the height of the element isolation upper surface 39, the distances L1, L2, and L3 can be considered to be substantially the same. As a result, the processing margin at the time of forming contact holes for the gate contact plugs 43 is widened, thereby improving the yield at the time of manufacture.

After the aforementioned steps, the semiconductor memory device according to the first embodiment shown in FIG. 1 can be achieved.

In the memory cell region of this device, the aspect ratio at the time of filling up the element isolation grooves 6 is high. As a result, a good embedding characteristic can be achieved, thereby improving the yield.

In the high voltage transistor region, since the element isolation grooves 23 are deep, it is possible to improve the element isolation withstand voltage. As a result, it is possible to improve the performance of the device.

That is, according to the first embodiment, the embedding characteristic of the element isolation grooves 6 of the memory cell region and the element isolation withstand voltage in the high voltage transistor region can be improved at the same time.

In addition, the depth of the element isolation grooves 6 in the low voltage transistor region are shallower than the depth of the element isolation groove 23 of the high voltage transistor region having a relatively thick gate insulating layer 17, the low voltage transistor region having a relatively thin gate insulating layer 16 as in the case of the memory cell region which has a relatively thin ONO layer 15 having a three-layer structure including the tunnel insulating layer 12, the charge accumulating layer 13, and the block insulating layer 14 and serving as the gate insulating layer. That is, the depth of the element isolation grooves 6 in the low voltage transistor region is substantially the same as the depth of the element isolation grooves 6 in the memory cell region. Accordingly, it is possible to obtain a good embedding characteristic of the element isolation grooves 6 even in the low voltage transistor region.

Figure 2:
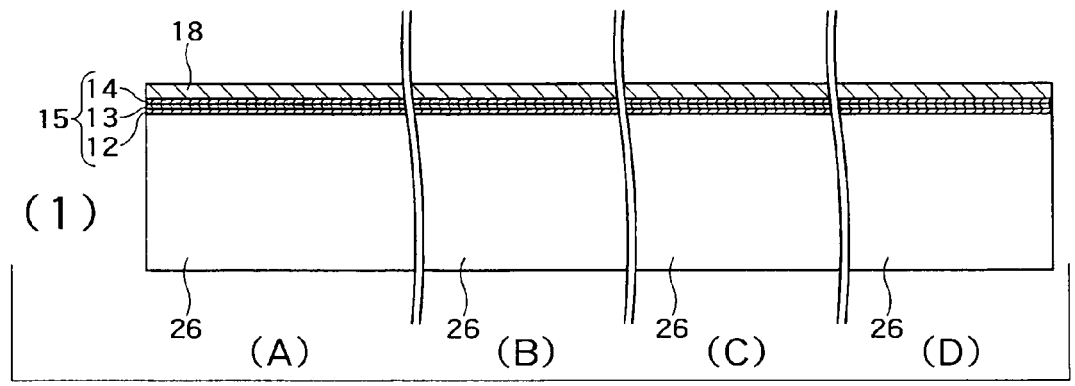
FIG. 2 is a sectional view showing one step of a method of manufacturing the semiconductor memory device according to the first embodiment.

The height of the element isolation grooves 6 in the low voltage transistor region including a relatively thin gate insulating layer 16 is lower than the height of the element isolation grooves 6 in the memory cell region including a relatively thin ONO layer 15 serving as a gate insulating layer, and the height of the element isolation grooves 23 in the high voltage transistor region including a relatively thick gate insulating layer 17. As a result, the step between the element region and the element isolation region in the low voltage transistor region becomes small. Accordingly, it is possible to reduce the degree of the step at the time of depositing the first gate electrode 18 (35), as shown in FIG. 2 (20). As a result, it is possible to maintain the uniformity of the etching rate in the low voltage transistor region at a high level at the time of performing anisotropic etching on the first gate electrode 18.

Generally, the gate insulating layer 16 in the low voltage transistor region is thinner than the gate insulating layer 17 in the high voltage transistor region. As a result, if the etching uniformity were not so good, the gate insulating layer 16 would be removed by etching in an area where the etching rate is high, resulting in that the substrate 26 would also be etched often, thereby degrading the performance of the transistor and the manufacturing yield. However, according to the first embodiment, it is possible to improve the uniformity in etching processing of the first gate electrode 18 by lowering the height of the element isolation grooves 6 in the low voltage transistor region, thereby improving the performance of the low voltage transistor region and the manufacturing yield.

According to the method of manufacturing a semiconductor memory device in the first embodiment, the ONO layer 15 composed of the tunnel insulating layer 12, the charge accumulating layer 13, and the block insulating layer 14 is used as an etching stopper in the memory cell region when anisotropic etching is performed on the substrate 26 in the high voltage transistor region in order to form the element isolation grooves 23. As a result, the substrate 26 in the memory cell region is not etched. Then, after the ONO layer 15 is removed, the element isolation grooves 6 and 23 in the memory cell region, the low voltage transistor region, and the high voltage transistor region are formed by etching the substrate 26. Accordingly, it is possible to make the element isolation grooves 6 of the memory cell region and the low voltage transistor region shallower than the element isolation grooves 23 in the high voltage transistor region without performing photolithography, thereby performing the manufacture at a lower cost. In addition, as in the case of the memory cell region, it is possible to form shallower element isolation grooves 6 in the low voltage transistor region. Thus, it is possible to achieve a good embedding characteristic as in the case of the memory cell region.

Furthermore, according to the method of manufacturing a semiconductor memory device in the first embodiment, the element isolation grooves 6 and 23 in the memory cell region, the low voltage transistor region, and the high voltage transistor region are formed in a self-aligned manner with respect to the first gate electrode 18. Then, after the element isolation grooves 6 and 23 are filled with the insulating member 33, only the ONO layer 15 and the first gate electrode 18 in the low voltage transistor region are removed. Thereafter, the gate insulating layer 16 and the gate electrode member 35 (which will be referred to as "first gate electrode 18" later) are formed. At this time, the ONO layer 15, the gate insulating layer 17, and the first gate electrode 18 in the memory cell region and the high voltage transistor region are not removed. In addition, the channel impurity of the low voltage transistor region is doped after the formation of the element isolation grooves 6.

With such a manufacturing method, it is possible to eliminate fluctuations in characteristics in the memory cell region and the high voltage transistor region caused by the electric field concentration at the element isolation edge. In addition, it is possible to form a highly reliable and highly integrated device. At the same time, in the low voltage transistor region, it is possible to make the channel impurity profile of each transistor steeper, thereby avoiding the degradation of the transistor performance caused by the short-channel characteristic. That is, since the gate length of a low voltage transistor is shorter than that of a high voltage transistor, the effect of improving the short-channel characteristic is more remarkable in the low voltage transistor.

In the aforementioned method, it is preferable that the difference between the depth of the element isolation grooves 6 and the depth of the element isolation grooves 23 were set to be in the range of 10 nm to 150 nm.

The difference between the depth of the element isolation grooves 6 and the element isolation grooves 23 can be set to be more than the thickness of the ONO layer 15.

Unlike the method shown in JP Laid-Open Publication No. 2002-313967, which was mentioned as the prior art reference, in the method of manufacturing the semiconductor memory device of the first embodiment, the first gate electrode 18 in the memory cell region and the high voltage transistor region is formed immediately after the formation of the ONO layer 15 and the gate insulating layer 17, before the formation of the element isolation grooves 6 and 23. Accordingly, it is not likely that the ONO layer 15 and the gate insulating layer 17 are contaminated by the impurity, which is effective to make the device highly reliable.

Second Embodiment

Figure 25:
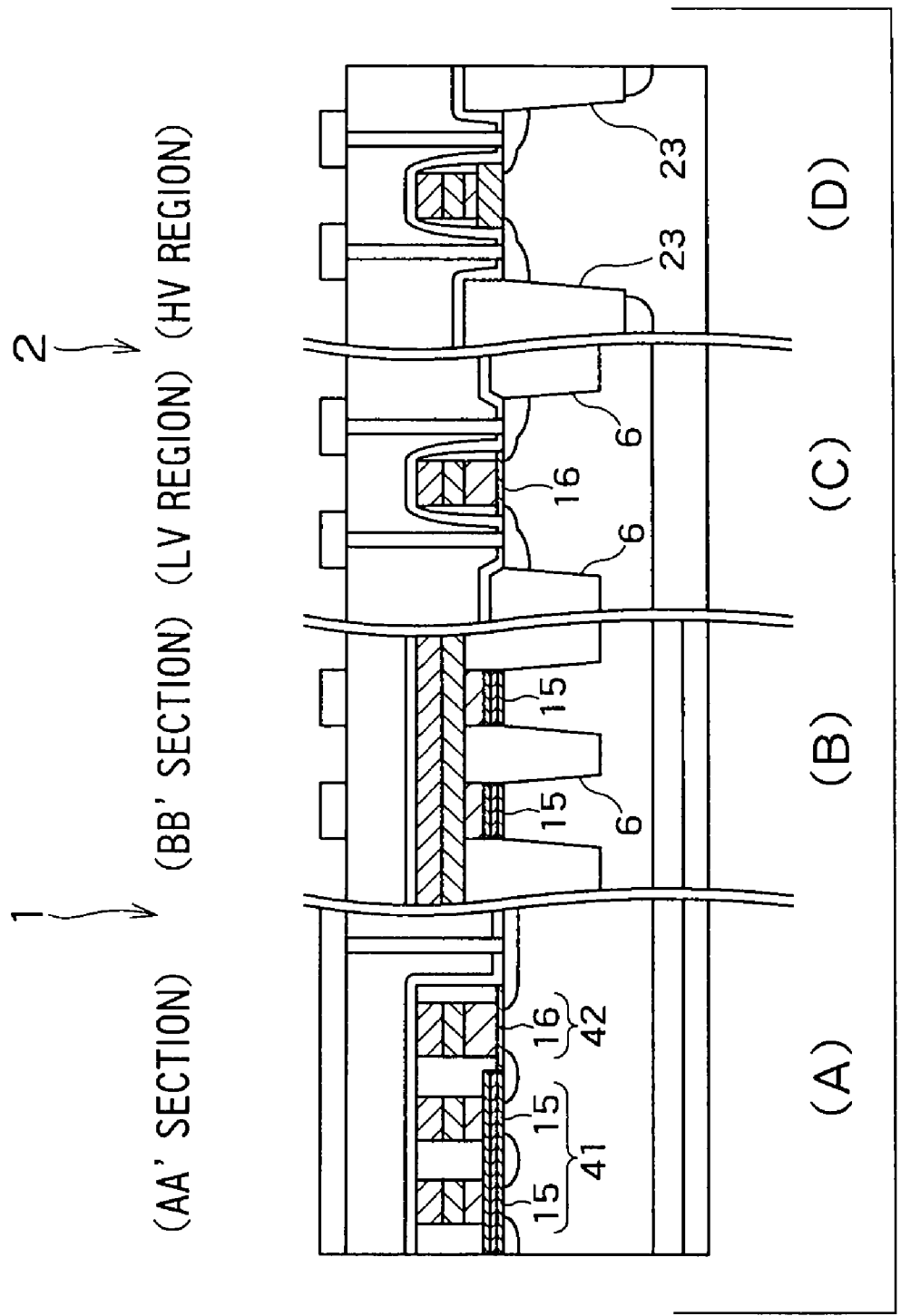
FIG. 25 is a sectional view of a semiconductor memory device according to the second embodiment of the present invention.

FIG. 25 shows sectional views of a semiconductor memory device according to a second embodiment of the present invention, in which (A) shows the gate section in the memory cell region, (B) shows the element isolation section in the memory cell region, (C) shows the low voltage transistor region, and (D) shows the high voltage transistor region.

The difference between FIGS. 1 and 25 lies in that the gate section in the memory cell region shown in FIG. 25(A).

In the first embodiment, all of the transistors in the memory cells region, i.e., the transistors for storage, and the transistors for selecting and controlling other transistors, have the same MONOS structure. However, in the second embodiment, the transistors in the memory cell region are divided into two groups, i.e., those located in a storage region 41 for storing information, and those located in a control region 42 for selecting memory cells. The transistors located in the storage region 41 have the MONOS structure as in the case of the transistors in the memory cell region of the first embodiment, and the transistors located in the control region 42 have the MOS structure as in the case of the low voltage transistor region shown in FIG. 25(C).

In the control region 42, the transistors are not required to have a storage function, but need only a switching function as in the case of the transistors in the low voltage transistor region. Therefore, only the transistors in this region can have the same structure as the transistors in the low voltage transistor region.

The process of forming the transistors in the control region 42 is exactly the same as that of forming the transistors in the low voltage transistor region in the first embodiment. Thus, in the control region 42 in the memory cell region, the transistors have the gate insulating layer 16 instead of the ONO layer 15, and the process of forming the first gate electrode 18 is the same as that in the low voltage transistor region. Accordingly, the depth and the height of the element isolation grooves 6 in this region are the same as those in the low voltage transistor region, resulting in that the same effect as the transistors in the low voltage transistor region can be obtained for the selecting transistors located in the control region 42 in the memory cell region.

Third Embodiment

Figure 26:
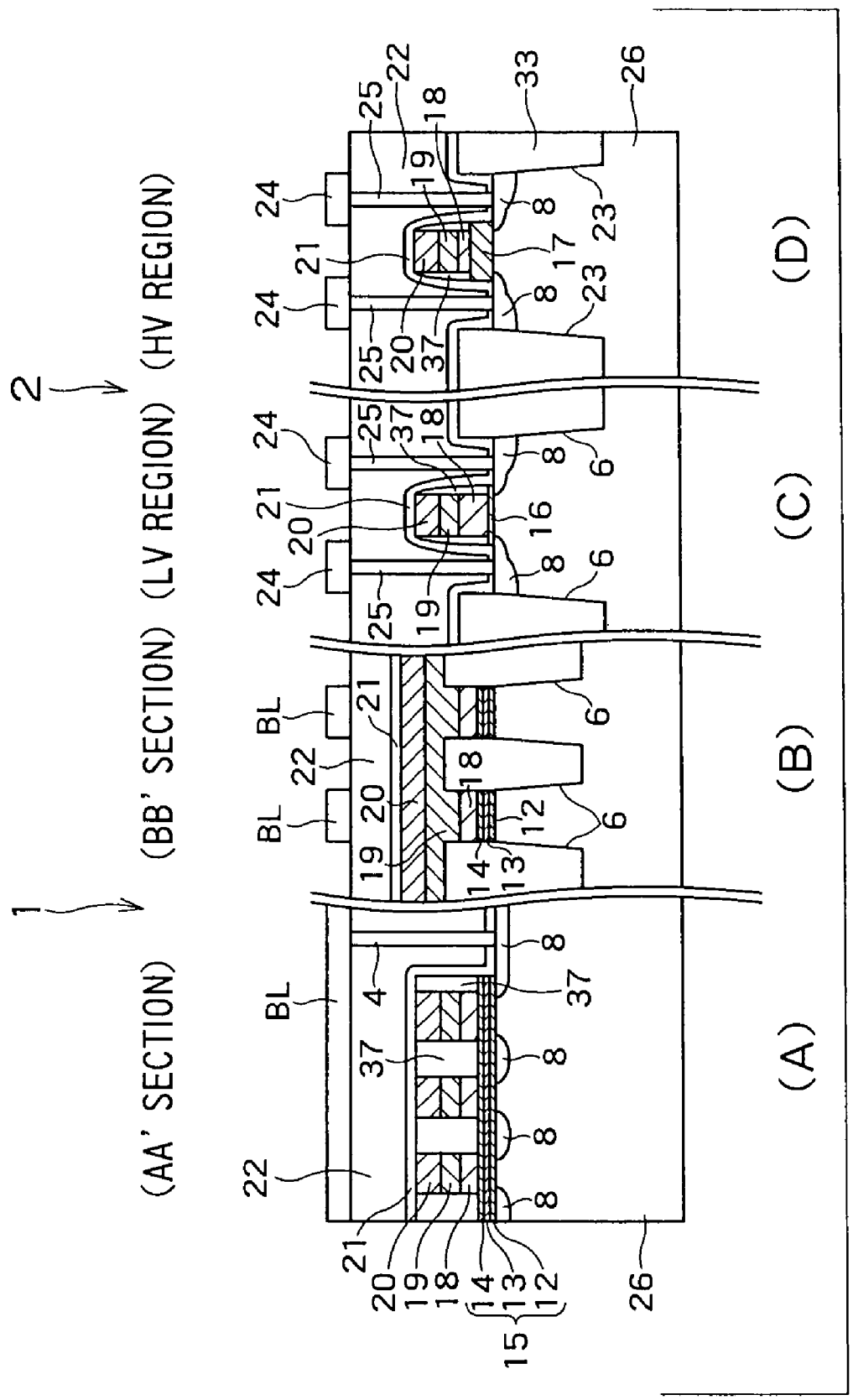
FIG. 26 is a sectional view of a semiconductor memory device according to the third embodiment of the present invention.

FIG. 26 shows sectional views of a semiconductor memory device of the third embodiment. The difference between FIGS. 1 and 26 lies in that the depth of the element isolation grooves 6 in the low voltage transistor region is deeper than the depth of the element isolation grooves 6 in the memory cell region, and substantially the same as the depth of the element isolation grooves 23 in the high voltage transistor region.

According to the semiconductor memory device of the third embodiment, the element isolation grooves 6 and 23, which should desirably be as deep as possible in order to maintain an element isolation withstand voltage, in the high and low voltage transistor regions are deeper than those in the memory cell region. That is, the semiconductor memory device of this embodiment has a structure suitable for improving withstand voltage.

In addition, according to the semiconductor memory device of the third embodiment, the element isolation grooves 6, which should desirably be as shallow as possible in order to improve the manufacturing yield, in the memory region are shallower than those in the low voltage transistor region and the high voltage transistor region. That is, the semiconductor memory device of this embodiment has a structure suitable for facilitating the manufacture and improving the yield at the time of designing highly integrated memory cells having a large capacity.

That is, according to the semiconductor memory device of the third embodiment, the trench grooves in the memory cell region, which should desirably be as shallow as possible in order to improve the yield, are formed to be shallow, and the trench grooves in the low voltage transistor region and the high voltage transistor region of the peripheral circuit, which should desirably be as deep as possible in order to improve the element isolation withstand voltage, are formed to be deep. Accordingly, it is possible to achieve a semiconductor memory device which is easy to manufacture, has a high yield and a high element isolation withstand voltage, and offers high performance.

Next, a method of manufacturing a semiconductor memory device according to the third embodiment will be described with reference to FIGS. 27-38.

The sections (A)s, (B)s, (C)s, and (D)s in FIGS. 27-38 correspond to the sections (A), (B), (C), and (D) of FIG. 26.

In order to simplify the explanation, the n-type well 10, the p-type well 11, and the p-type regions 27 at the bottom of the element isolation grooves 23 on the p-type substrate 9, which are shown in FIG. 1 used to explain the first embodiment, are not shown, but are collectively illustrated as the substrate 26.

Figure 27:
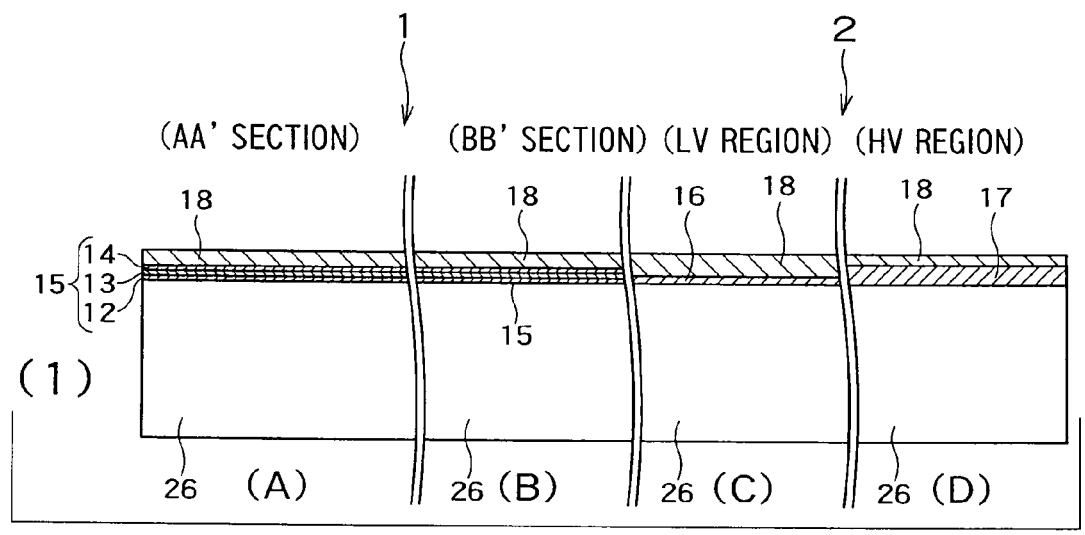
FIG. 27 is a sectional view for explaining a method of manufacturing the semiconductor memory device according to the third embodiment.

First, as shown in FIG. 27, a sacrificial oxide layer (not shown) having a thickness of 1-100 nm is formed on a p-type silicon substrate containing boron as an impurity at a concentration of $10^{14}$-$10^{19}$ (cm$^{-3}$). Then, a resist is applied, lithography is performed, and then ions of, e.g., phosphorus, arsenic, antimony, etc., are doped into the memory cell region at an acceleration energy of 30-1,500 KeV, and a dose amount of $1\times10^{11}$-$1\times10^{15}$ (cm$^{-2}$), thereby forming an n-type well in the memory cell region.

Further, boron, for example, is doped into the memory cell region and the low voltage transistor region at an acceleration energy of 100-1,000 KeV and with a dose amount of $1\times10^{11}$-$1\times10^{15}$ (cm$^{-2}$), thereby forming a p-type well in the memory cell region and the low voltage transistor region.

Furthermore, a resist is applied, lithography is performed, and then an impurity such as boron, indium, etc. is doped into the memory cell region and the high voltage transistor region at a dose amount of $1\times10^{11}$-$1\times10^{14}$ (cm$^{-2}$) as channel ions.

Subsequently, the sacrificial oxide layer is removed, and a silicon oxide layer or an oxynitride layer having a thickness of 0.5-10 nm is formed on the substrate 26 in the memory cell region, the formed layer serving as the tunnel insulating layer 12 of the MONOS structure.

Then, a silicon nitride layer having a thickness of 3-50 nm, serving as the charge accumulating layer 13, is formed thereon.

Thereafter, a silicon oxide layer or an oxynitride layer having a thickness of 3-30 nm, serving as the blocking insulating layer 14, is formed thereon.

After the aforementioned steps, the ONO layer 15 composed of the tunnel insulating layer 12, the charge accumulating layer 13, and the block insulating layer 14, which serves as the gate insulating layer, is formed.

In the low voltage transistor region, the gate insulating layer 16 is formed by depositing a silicon oxide layer or an oxynitride layer having a thickness of 0.5 nm. In the high voltage transistor region, the gate insulating layer 17 is formed by depositing an oxide layer or an oxynitride layer having a thickness of 10-50 nm.

Then, an amorphous silicon or polycrystalline silicon layer having a thickness of 10-500 nm, which is a material of the gate electrode, is formed on the surface of the ONO layer 15 and the gate insulating layers 16 and 17.

Considering the later step of doping impurities to form different conductivity types of gate electrodes, it is preferable that the silicon layer to become the first gate electrode 18 included no impurity. However, a polycrystalline silicon layer containing $1 \times 10^{19} - 1 \times 10^{21}$ (cm$^{-3}$) of phosphorus as an impurity is acceptable. Furthermore, the thickness of the first gate electrode 18 can be the same in all the regions. Alternatively, at least two of the sum of the thicknesses of the ONO layer 15 and the first gate electrode 18 in the memory cell region, the sum of thicknesses of the gate insulating layer 16 and the first gate electrode 18 in the low voltage transistor reigon, and the sum of the thicknesses of the gate insulating layer 17 and the first gate electrode 18 in the high voltage transistor region can be the same.

Figure 28:
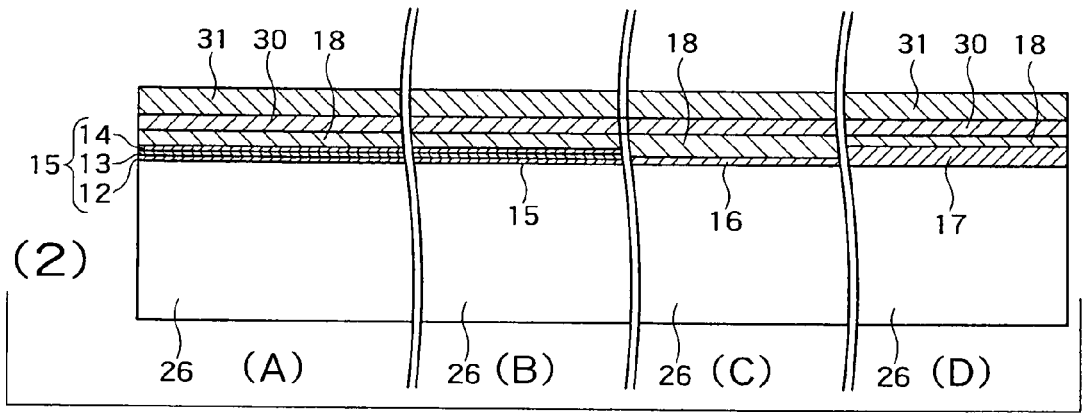
FIG. 28 is a sectional view for explaining the method of manufacturing the semiconductor memory device according to the third embodiment.

Subsequently, as shown in FIG. 28, a first insulating layer 30 of a silicon nitride layer, etc., and a second insulating layer 31 of a silicon oxide layer, each having a thickness of 10-200 nm, are deposited on the entire surface of the wafer.

Figure 29:
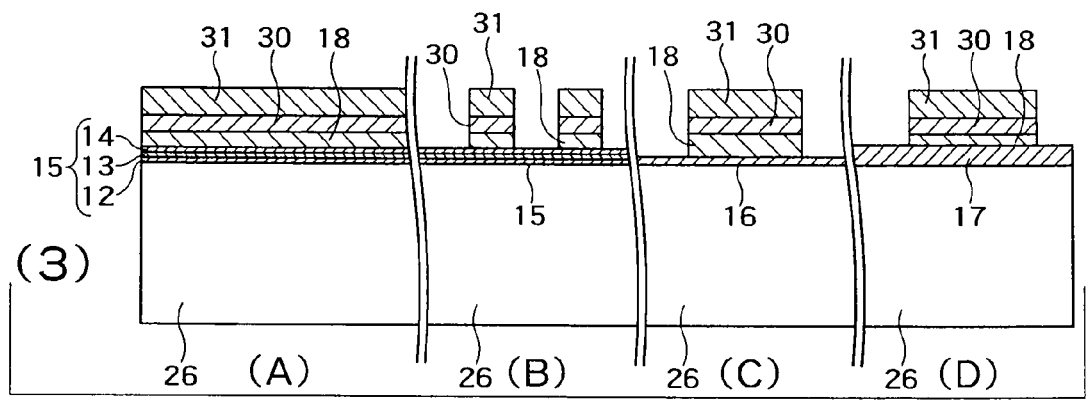
FIG. 29 is a sectional view for explaining the method of manufacturing the semiconductor memory device according to the third embodiment.

Then, as shown in FIG. 29, lithography and anisotropic etching are performed on the first insulating layer 30, the second insulating layer 31, and the polycrystalline silicon layer to become the first gate electrode 18.

Figure 30:
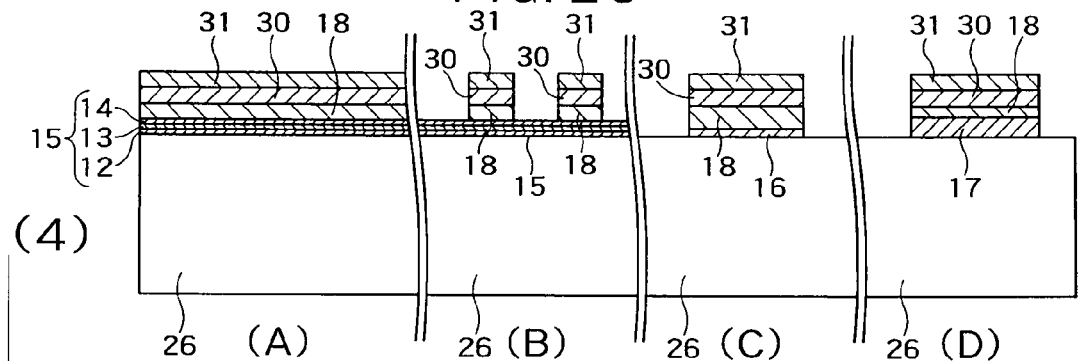
FIG. 30 is a sectional view for explaining the method of manufacturing the semiconductor memory device according to the third embodiment.

Thereafter, as shown in FIG. 30, anisotropic etching is performed on the block insulating layer 14 of the memory cell region, the gate insulating layer 16 of the low voltage transistor region, and the gate insulating layer 17 of the high voltage transistor region. In the memory cell region, the charge accumulating layer 13 serving as a charge accumulating insulating layer formed of a silicon nitride layer is left.

Figure 31:
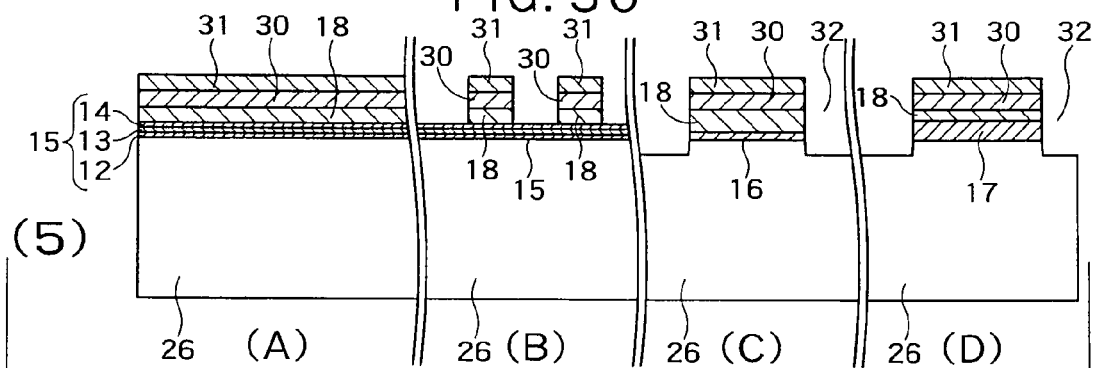
FIG. 31 is a sectional view for explaining the method of manufacturing the semiconductor memory device according to the third embodiment.

Subsequently, as shown in FIG. 31, anisotropic etching is performed on the silicon substrate in the high voltage transistor region, using the first insulating layer 30 and the second insulating layer 31 as masks, under an etching condition having a selectivity with respect to silicon nitride layer, thereby forming the step portions 32 of the element isolation grooves having a depth of for 10-100 nm. It is preferable that an etching condition were selected so that the etching rate of the substrate 26 would be more than the etching rate of the charge accumulating layer 13. By employing such an etching condition, it is possible to form the step portions 32 for making element isolation grooves having a sufficient depth in the low and high voltage transistor regions without performing photolithography.

Figure 32:
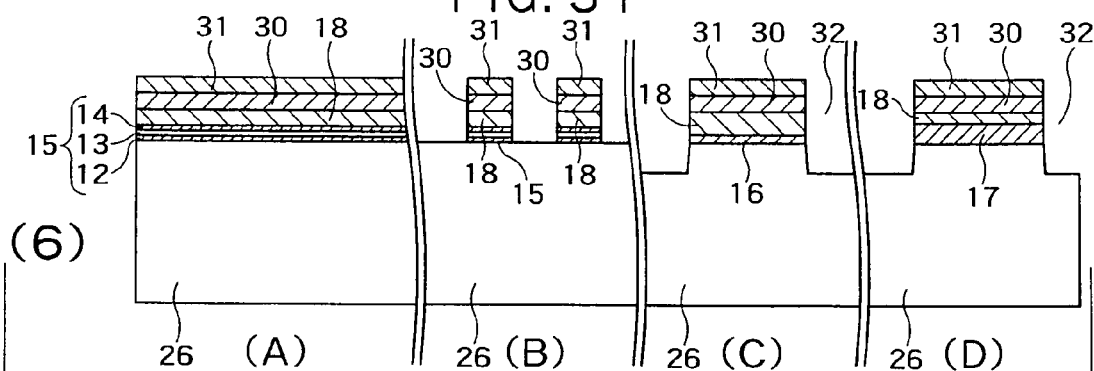
FIG. 32 is a sectional view for explaining the method of manufacturing the semiconductor memory device according to the third embodiment.

Then, as shown in FIG. 32, anisotropic etching is performed on the charge accumulating layer 13 and the tunnel insulating layer 12 in the memory cell region and the low voltage transistor region, using the first insulating layer 30 and the second insulating layer 31 as masks. At this time, the substrate 26 in the low and high voltage transistor regions can also be etched by employing an etching condition having a low selectivity with respect to the substrate 26. As a result, the substrate 26 is exposed in the memory cell region. In the high and low voltage transistor regions, the step portions 32 of the element isolation grooves are deepened further by 5-50 nm.

Figure 33:
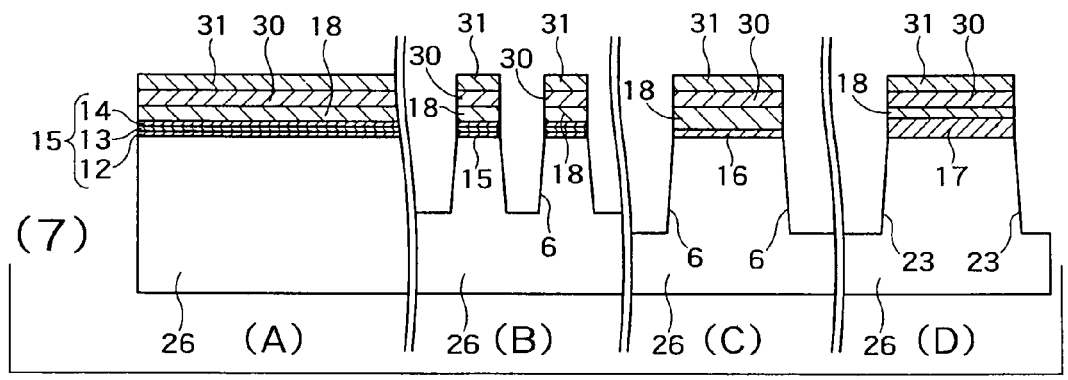
FIG. 33 is a sectional view for explaining the method of manufacturing the semiconductor memory device according to the third embodiment.

Next, as shown in FIG. 33, anisotropic etching is performed on the substrate 26 using the first insulating layer 30 and the second insulating layer 31 as masks, thereby forming the element isolation grooves 6 having a depth of 30-500 nm in the memory cell region. Since the step portions 32 for making element isolation grooves have been formed in the low voltage transistor region and the high voltage transistor region, the element isolation grooves 6 and 23 which are deeper than the element isolation grooves 6 in the memory cell region by 10-150 nm are formed in these regions.

Figure 34:
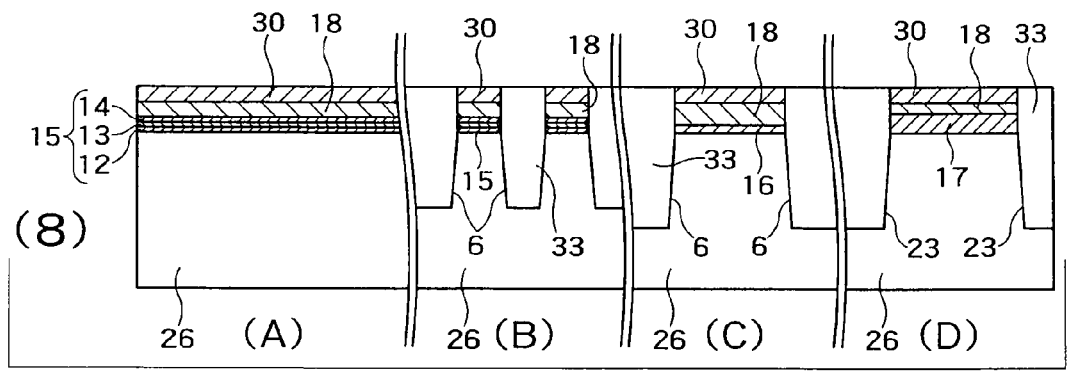
FIG. 34 is a sectional view for explaining the method of manufacturing the semiconductor memory device according to the third embodiment.

Thereafter, as shown in FIG. 34, the element isolation grooves 6 and 23 are filled with the insulating member 33 formed of a silicon oxide layer, etc., which is then flattened by CMP, etc. At this time, the second insulating layer 31 is removed by CMP, and the first insulating layer 30 works as an etching stopper against CMP.

If the height of the first gate electrode 18 formed on the ONO layer 15 in the memory cell region and the height of the first gate electrode 18 formed on the gate insulating layer 17 in the high and low voltage transistor regions had been aligned before the CMP step, even if the depths of the element isolation grooves 6 and 23 varied depending on the regions, the height of the first insulating layer 30 serving as the etching stopper would become the same in all of the memory cell region, the low voltage transistor region, and the high voltage transistor region. Accordingly, the CMP step could be performed more easily, thereby improving the yield.

Figure 35:
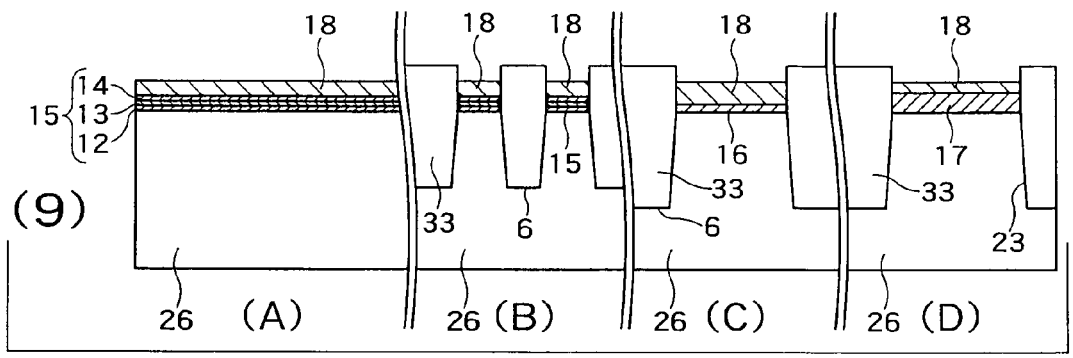
FIG. 35 is a sectional view for explaining the method of manufacturing the semiconductor memory device according to the third embodiment.

Then, as shown in FIG. 35, the first insulating layer 30 is removed by wet etching, etc., thereby exposing the first gate electrode 18 in all of the memory cell region, the low voltage transistor region, and the high voltage transistor region.

Figure 36:
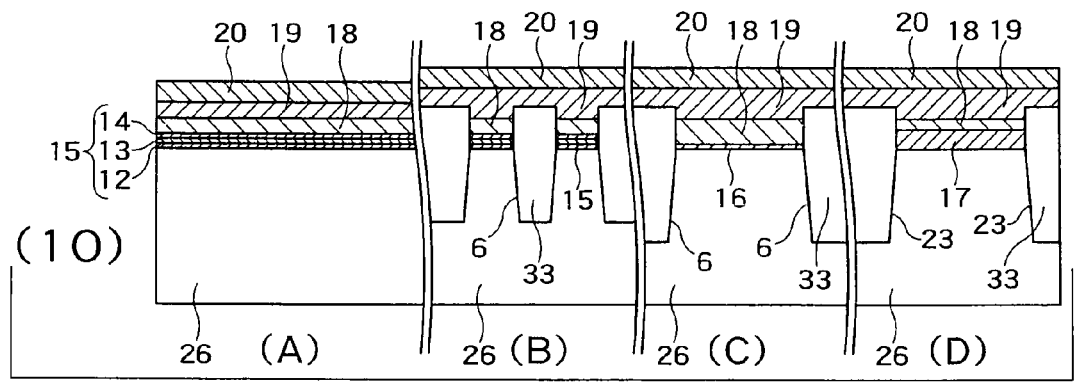
FIG. 36 is a sectional view for explaining the method of manufacturing the semiconductor memory device according to the third embodiment.

Thereafter, as shown in FIG. 36, a metal lining layer of, e.g., WSi, NiSi, MoSi, TiSi, CoSi, etc., having a thickness of 1-500 nm is formed, the metal lining layer serving as the second gate electrode 19. Then, the mask insulating layer 20 formed on a silicon oxide layer or a silicon nitride layer having a thickness of 10-300 nm is formed thereon.

Figure 37:
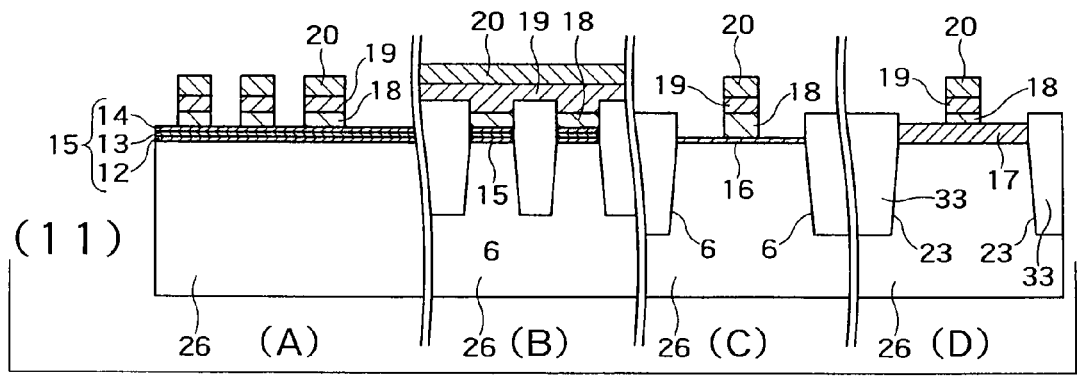
FIG. 37 is a sectional view for explaining the method of manufacturing the semiconductor memory device according to the third embodiment.

Subsequently, as shown in FIG. 37, photolithography and anisotropic etching is performed on the first gate electrode 18, the second gate electrode 19 and the mask insulating layer 20, thereby forming the gate structure of each transistor.

Figure 38:
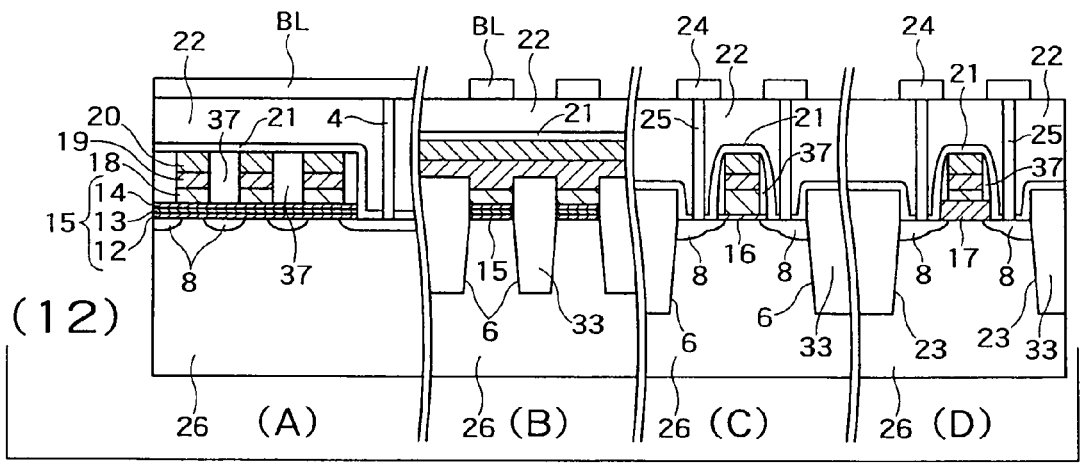
FIG. 38 is a sectional view for explaining the method of manufacturing the semiconductor memory device according to the third embodiment.

Then, as shown in FIG. 38, the sidewall insulating layer 37 and the source and drain regions 8 of each transistor are formed. Thereafter, each transistor is covered by the barrier insulating layer 21, and the interlayer insulating layer 22 is deposited thereon. After the interlayer insulating layer 22 is flattened, bit line contacts 4 are formed in the memory cell region, and contacts 25 are formed in the high and low voltage transistor regions. Metal bit lines BL are formed in the memory cell region, and metal signal lines 24 are formed in the high and low voltage transistor regions, each line connecting to a corresponding contact.

After the aforementioned steps, a passivation layer is deposited, thereby completing the semiconductor memory device of the third embodiment of the present invention shown in FIG. 26.

Since the aspect ratio at the time of filling up the element isolation grooves 6 becomes higher in the memory cell region, it is possible to obtain a good embedding characteristic, thereby improving the yield.

Furthermore, since the element isolation grooves 6 and 23 are deep in the high and low voltage transistor regions, it is possible to improve the element isolation withstand voltage, thereby making the device offer higher performance.

Thus, according to the third embodiment, the embedding characteristic of the element isolation grooves 6 in the memory cell region and the element isolation withstand voltage in the high and low voltage transistor regions can be simultaneously improved. That is, the embedding characteristic of the element isolation grooves 6 in the memory cell region can be improved without degrading the withstand voltage of the transistors in the high and low voltage transistor regions.

Furthermore, although the depth of the element isolation grooves 6 in the memory cell region, in which a relatively thin ONO layer 15 serves as the gate insulating layer, is shallower than the depth of the element isolation grooves 6 in the low voltage transistor region having a relatively thin gate insulating layer 16 and the element isolation groove 23 in the high voltage transistor region having a relatively thick gate insulating layer 17, the heights of the insulating members 33 filling up the element isolation grooves 6 and 23 in the respective regions are substantially the same. Accordingly, it is possible to align the height of the element isolation portions in all the regions of the wafer, thereby reducing the manufacturing fluctuations in the later stages such as in the step of forming gate electrode and in the step of improving the yield.

According to the manufacturing method for achieving the structure of the third embodiment, the ONO layer 15 composed of the tunnel insulating layer 12, the charge accumulating layer 13, and the block insulating layer 14 is used as the etching stopper layer in the memory cell region when anisotropic etching is performed on the substrate 26 in the high and low voltage transistor regions in order to form the element isolation grooves 6 and 23. Accordingly, the substrate 26 is not etched in the memory cell region. After the ONO layer 15 is removed, the substrate 26 is further etched in order to form the element isolation grooves 6 and 23 in all of the memory cell region, the low voltage transistor region, and the high voltage transistor region. Therefore, it is possible to make the element isolation grooves 6 in the memory cell region shallower than the element isolation grooves 6 and 23 in the high and low voltage transistor regions without performing photolithography. Thus, it is possible to manufacture the device at a lower cost. Furthermore, it is possible to form deeper element isolation grooves 6 in the low voltage transistor region as in the case of the high voltage transistor region. Accordingly, it is possible to achieve a good withstand voltage characteristic and good element isolation performance as in the case of the high voltage transistor region.

It is preferable that in the aforementioned method, the difference between the depth of the element isolation grooves 6 and the depth of the element isolation grooves 23 were set to be in the range of 10 nm to 150 nm.

The difference between the depth of the element isolation grooves 6 and the depth of the element isolation grooves 23 can be set to be more than the thickness of the ONO layer 15.

Fourth Embodiment

Figure 39:
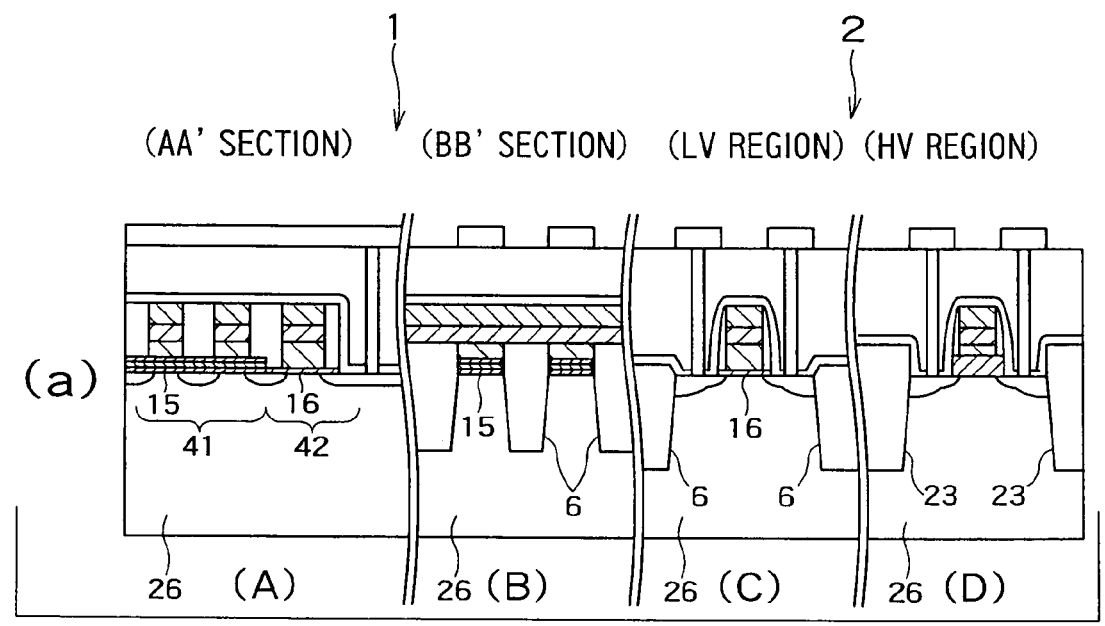
FIG. 39 is a sectional view for explaining a structure and a method of manufacturing a semiconductor memory device according to the fourth embodiment of the present invention.
Figure 40:
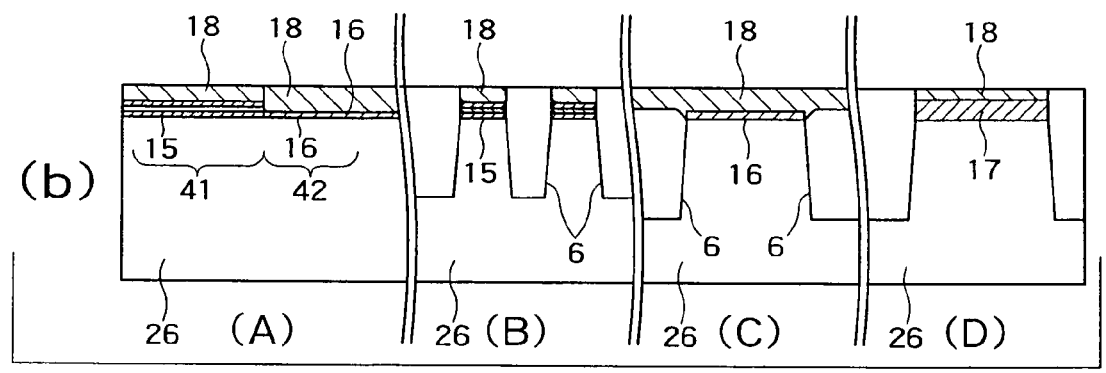
FIG. 40 is a sectional view for explaining the structure and the method of manufacturing a semiconductor memory device according to the fourth embodiment of the present invention.
Figure 41:
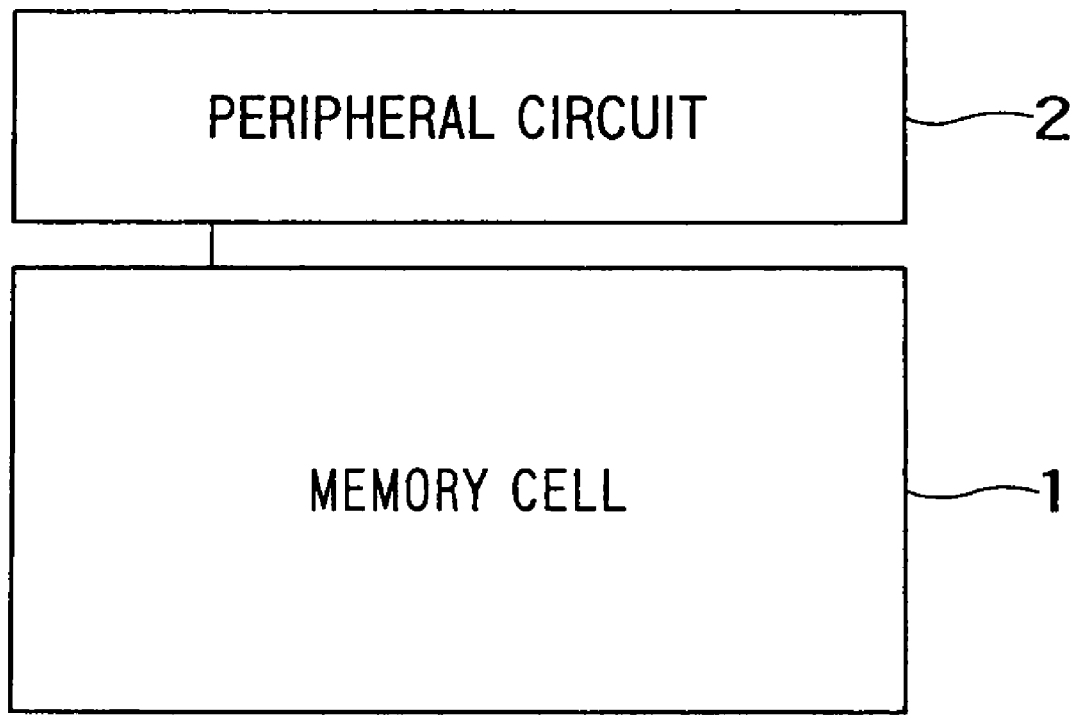
FIG. 41 is a plan view showing an example of a conventional NOMOS semiconductor memory device.

FIG. 39 shows sectional views of a semiconductor memory device according to a fourth embodiment of the present invention. FIG. 40 shows one step of a method of manufacturing the semiconductor memory device of this embodiment. In these drawings, (A) relates to the gate section in the memory cell region (corresponding to the section along line A-A'), (B) relates to a element isolation section in the memory cell region (corresponding to the section along line B-B'), (C) relates to the low voltage transistor region (LV region), and (D) relates to the high voltage transistor region (LV region).

The difference between FIG. 39 and FIG. 26 relating to the third embodiment lines in the gate section of the memory cell ((A)).

In the third embodiment, both the transistor for storage and the transistors for selecting and controlling other transistors in the memory cell region have the MONOS structure. In the fourth embodiment, the memory cell region is divided into a storage region 41 for storing information and a control region 42 for selecting cells. The transistors in the storage region 41 have the same MONOS structure as the transistors in the memory cell region of the first embodiment. The transistors in the control region 42 have the same MOS structure as the transistors in the low voltage transistor region shown in FIG. 39(C).

That is, the transistors in the control region 42 do not need a storage function, but only need a switching function, as in the case of the transistors in the low voltage transistor region. Accordingly, the transistors in this region can have the same structure as those in the low voltage transistor region.

As shown in FIG. 40(A), the transistors in the control region 42 include the gate insulating layer 16 instead of the ONO layer 15, as in the case of the transistors in the low voltage transistor region. The process of forming this region is the same as that of forming the low voltage transistor region. As a result, the depth and height of the element isolation grooves 6 in this region become the same as those in the low voltage transistor region. Accordingly, the same advantageous effect as that obtained for the transistors in the low voltage transistor region can be obtained for the selecting transistors located in the control region in the memory cell region.

Figure 42:
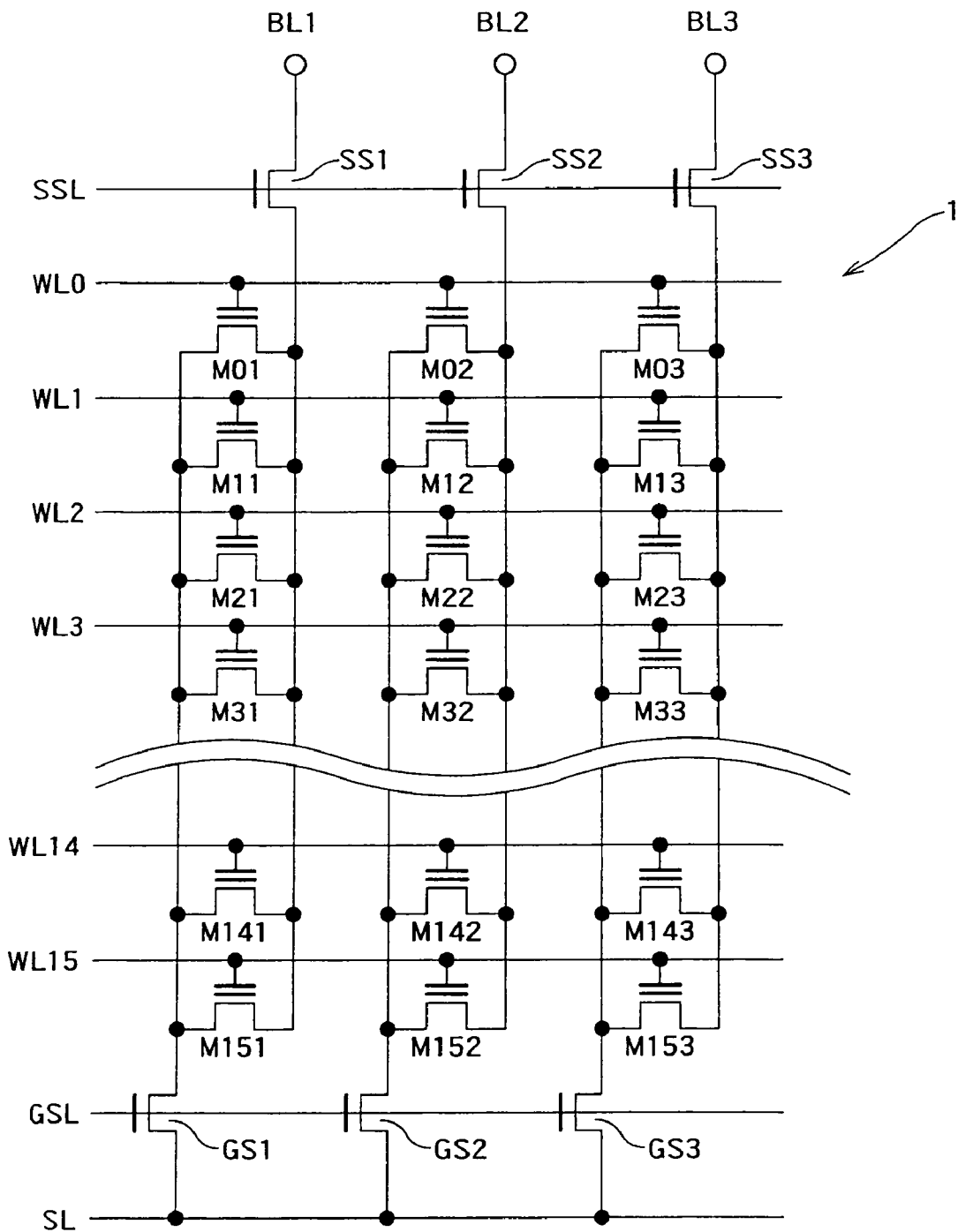
FIG. 42 is an equivalent circuit diagram showing a first example of an AND type structure of the memory cell region shown in FIG. 41.
Figure 43:
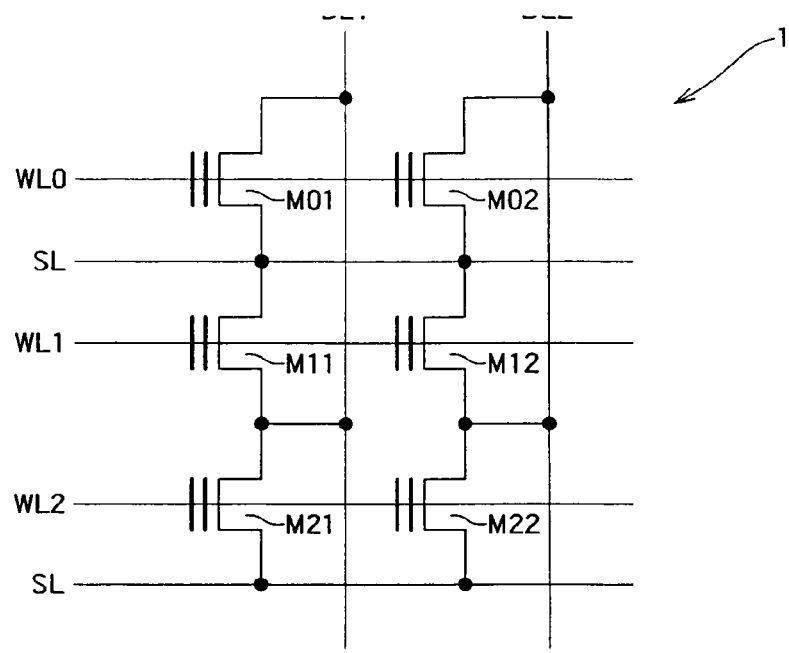
FIG. 43 is an equivalent circuit diagram showing a second example of a NOR type structure of the memory cell region shown in FIG. 41.
Figure 44:
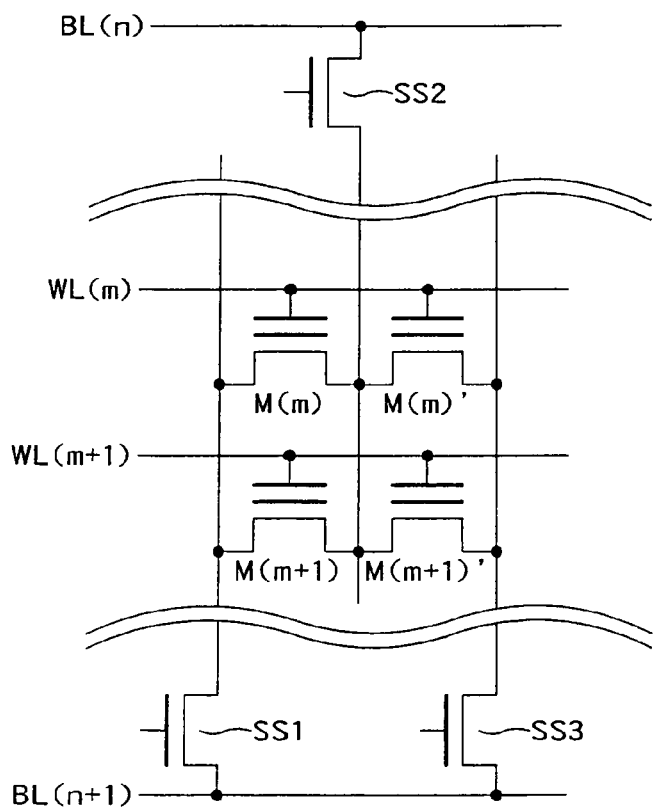
FIG. 44 is an equivalent circuit diagram showing a third example of a Virtual Ground Array type structure of the memory cell region shown in FIG. 41.
Figure 45:
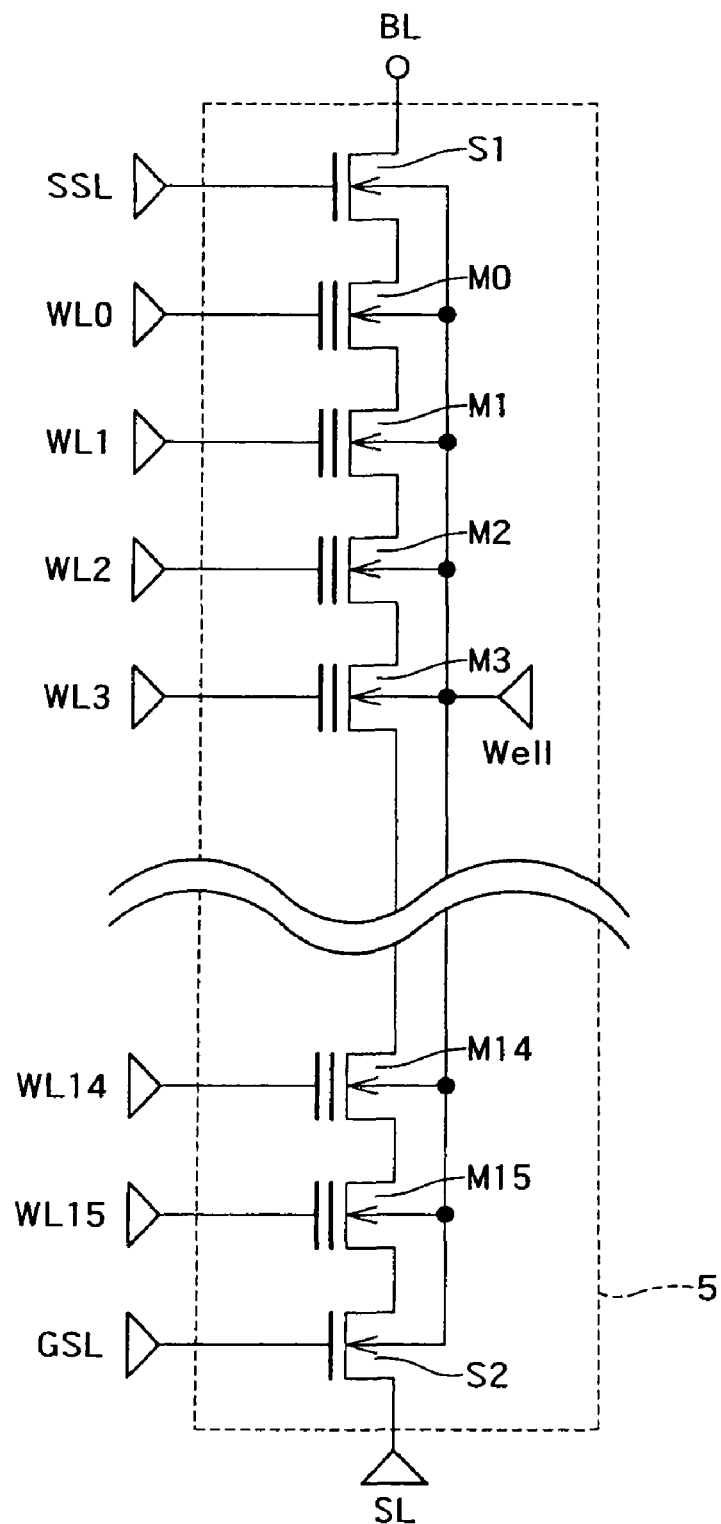
FIG. 45 is an equivalent circuit diagram showing a fourth example of a NAND type structure of the memory cell region shown in FIG. 41.

Although the explanations have been made for the NAND type EEPROM shown in FIG. 45 with respect to the embodiments of the present invention, the embodiments of the present invention are not limited to this type, but can be of an AND type EEPROM shown in FIG. 42, a NOR type EEPROM shown in FIG. 43, or a Virtual Ground Array type EEPROM shown in FIG. 44.

As described above, a remarkable feature of the present invention lies in that element isolation grooves having different depths are formed in a self-aligned manner at the boundary between an ONO layer serving as a gate insulating layer and a silicon oxide layer.

This will be described in more detail below.

Figure 51:
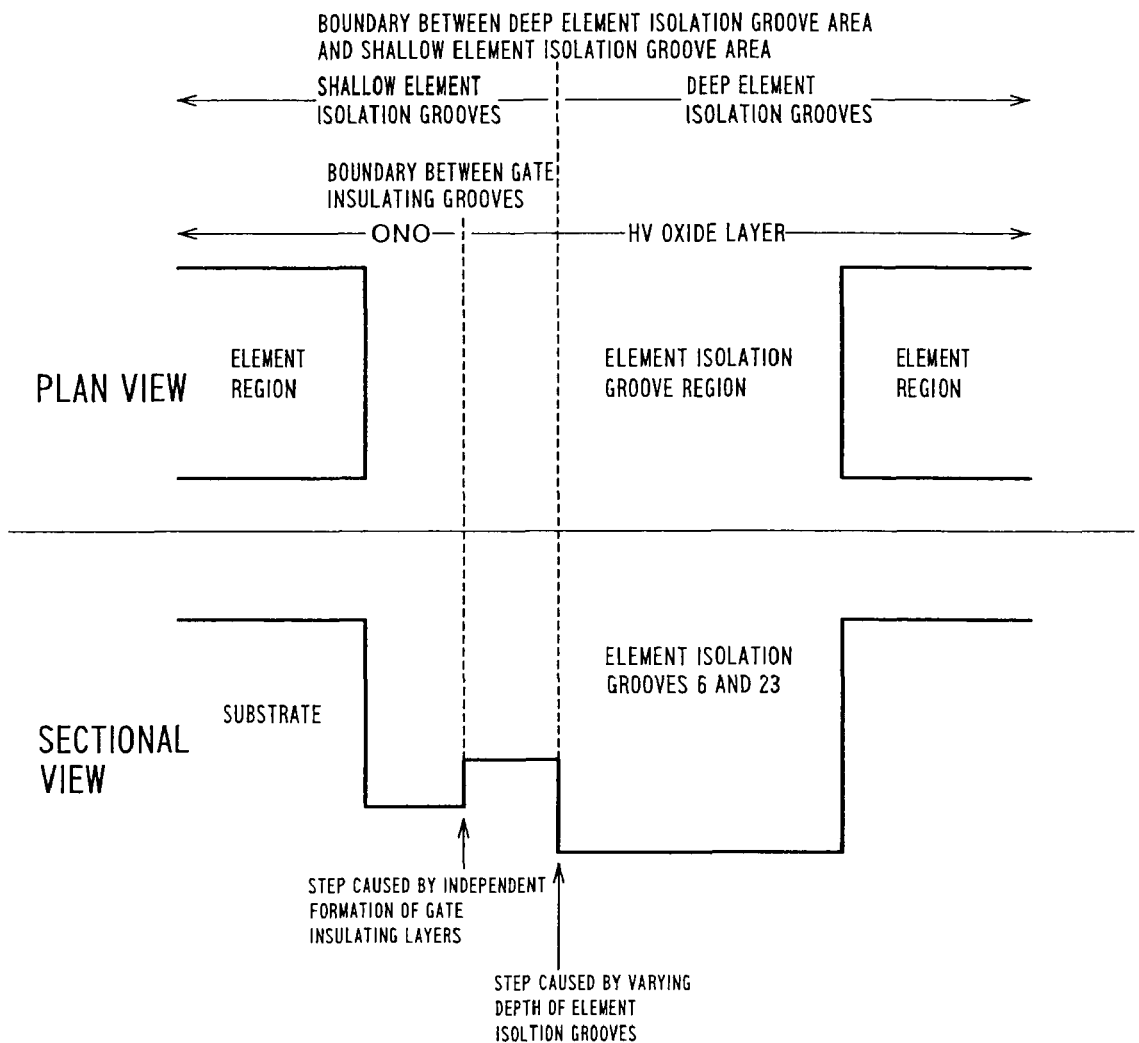
FIG. 51 shows a plan view and a sectional view relating to each other, which show the main part of the boundary between the memory cell region and the high voltage transistor region formed by lithography.
Figure 52:
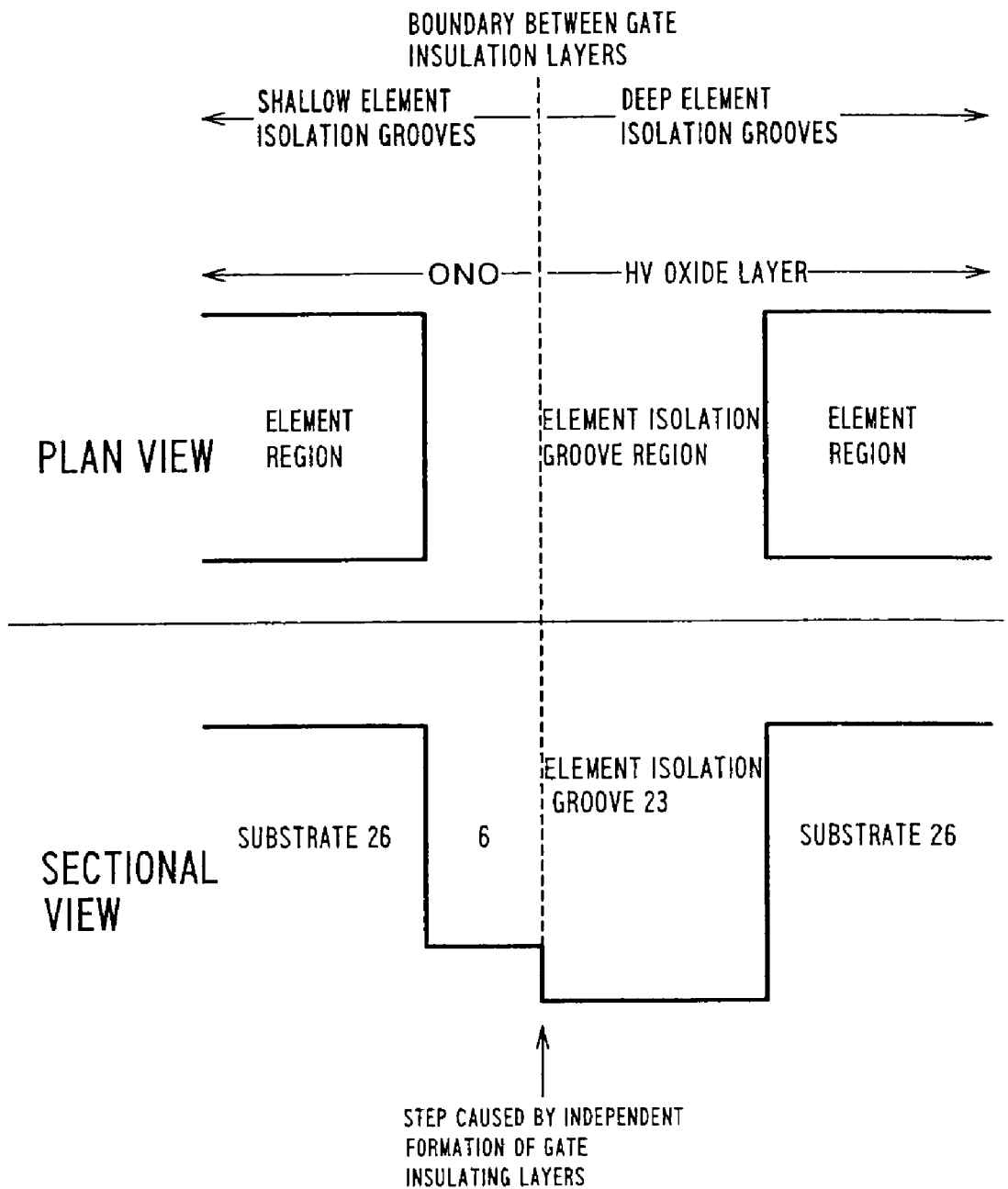
FIG. 52 shows a plan view and a sectional view relating to each other, which show the main part of the boundary between the memory cell region and the high voltage transistor region formed during a self-alignment step.

FIGS. 51 and 52 show the boundary portion between the memory cell region and the high voltage transistor region. For the sake of simplifying the explanation, only the element region (semiconductor substrate) and the element isolation grooves are shown.

The element region includes, for example, channel or guard ring of a transistor.

FIG. 51 shows a plan view and a sectional view of the case where the depths of the element isolation grooves in the memory cell region and the peripheral circuit region are changed. In this case, the lithography step for forming the gate insulating layers in the memory cell region and the high voltage transistor region independently of each other, and the lithography step for varying the depths of the element isolation grooves are separately performed. As a result, two step portions appear in the element isolation groove at the boundary area, as shown in FIG. 51.

Like this case, when the depths of the element isolation grooves are varied by lithography, problems arise that the number of steps increases, and that the area of the element isolation groove at the boundary portion increases.

FIG. 52 shows the case where the depths of the element isolation grooves are adjusted in a self-aligned manner at the boundary between different gate insulating layers, like the first to fourth embodiments of the present invention. Since the boundary between different depths of element isolation grooves and the boundary between different gate insulating layers match with each other in this case, only a single step portion is formed in the element isolation groove at the boundary portion.

Accordingly, when the depths of element isolation grooves are varied in a self-aligned manner at the boundary between different gate insulating layers, the lithography step for varying the depths of element isolation grooves can be omitted. In addition, an effect of reducing the area of element isolation groove at the boundary portion can be expected.

Further, although the explanations with respect to the first to fourth embodiments have been made for non-volatile semiconductor memory device including memory cells having a charge accumulating layer and transistors constituting a peripheral circuit, the memory cells and the transistors being formed on the same substrate, the present invention can be applied to, for example, the case where transistors including a gate insulating layer of silicon nitride layer and transistors including a gate insulating layer of silicon oxide layer, all the transistors being formed on the same substrate, and the element isolation grooves of the transistors including the silicon nitride layer are shallower than those of the transistors including the silicon oxide layer.

Furthermore, although a silicon nitride layer is used as the gate insulating layer of the memory cell in the first to fourth embodiments, the present invention is not limited thereto. The same effects as those obtained for the first to fourth embodiments can be obtained when a layer is used, the layer having an etching selectivity with respect to the silicon layer used as the gate insulating layer of the transistors of the peripheral circuit. For example, $HfO_2$, $Al_2O_3$, $Ta_2O_5$, $TiO_2$, etc., can be used as the charge accumulating layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

As described above, according to the embodiments of the present invention, in a semiconductor memory device including a memory cell region, a high voltage transistor region, and a low voltage transistor region, the element isolation grooves in at least the high voltage transistor region of the high and low transistor regions are formed to be deep in order to improve the element isolation characteristic and the withstand voltage, and the element isolation grooves in the memory cell region are formed to be shallow. With a device having such a structure and a method of manufacturing a device having such a structure, it is possible to achieve high integration, high performance, and a high manufacturing yield.

What is claimed is:

1. A method of manufacturing a semiconductor memory device comprising:
    a first region including a plurality of memory cell transistors, each memory cell transistor employing a first gate insulating layer having a laminated structure including at least a charge accumulating insulating layer;
    a second region including a plurality of transistors, each transistor employing a second gate insulating layer which is different from the charge accumulating insulating layer; and
    a third region including a plurality of transistors, each transistor employing a third gate insulating layer which is different from the charge accumulating insulating layer, and is thinner than the second gate insulating layer,
    the first, second and third regions being formed on a semiconductor substrate, wherein
    the first gate insulating layer is formed in the first, second and third region,
    the first gate insulating layer is removed in the second region,
    the second gate insulating layer is formed in the second region,
    mask layers to form element isolation trenches are formed in the first, second and third region,
    a first etching process is performed such that the charge accumulating insulating layer in the first region remains when the second gate insulating layer in the second region is already removed, and
    a second etching process is performed such that the first gate insulating layer in the first region is etched and at the same time the semiconductor substrate in the second region is etched, resulting in making a depth of a first element isolation trench in the first region, measured from a surface of the semiconductor substrate, shallower than a depth of a second element isolation trench in the second region, measured from the surface of the semiconductor substrate.

2. The method of manufacturing a semiconductor memory device according to claim 1, wherein the element isolation trenches are filled with an insulating material, and then the first gate insulating layer and gate electrodes in the third region are removed.

3. The method of manufacturing a semiconductor memory device according to claim 2, wherein after the first gate insulating layer and the gate electrodes are removed, the third gate insulating layer is formed on at least the semiconductor substrate in the third region.

4. The method of manufacturing a semiconductor memory device according to claim 1, wherein the second etching process includes removing the semiconductor substrate in the second region and maintaining the charge accumulating insulating layer in the first region.

5. The method of manufacturing a semiconductor memory device according to claim 4, wherein after the first etching process, the second etching process is performed such that the remaining charge accumulating insulating layer in the first region is etched under an etching condition having a low etching selectivity with respect to the semiconductor substrate.

6. The method of manufacturing a semiconductor memory device according to claim 5, wherein through the second etching process, the semiconductor substrate is also etched in the second region.

7. The method of manufacturing a semiconductor memory device according to claim 1, wherein the semiconductor substrate in the second region is etched under an etching condition having an etching selectivity with respect to the charge accumulating insulating layer.

8. The method of manufacturing a semiconductor memory device according to claim 7, wherein the etching condition having an etching selectivity with respect to the charge accumulating insulating layer has an etching rate of the semiconductor substrate being more than ten times that of the charge accumulating insulating layer.

9. The method of manufacturing a semiconductor memory device according to claim 1, wherein the semiconductor substrate is etched under an etching condition having an etching selectivity with respect to the charge accumulating insulating layer, and the semiconductor substrate is also etched in the second region.

* * * * *